(12) United States Patent
Kinoshita et al.

(10) Patent No.: US 6,525,350 B1
(45) Date of Patent: Feb. 25, 2003

(54) SEMICONDUCTOR INTEGRATED CIRCUIT BASIC CELL SEMICONDUCTOR INTEGRATED CIRCUIT USING THE SAME

(75) Inventors: Eita Kinoshita, Chiba (JP); Makoto Mizuno, Chiba (JP)

(73) Assignee: Kawasaki Steel Corporation, Hyogo (JP)

(*) Notice: Subject to any disclaimer, the term of this patent is extended or adjusted under 35 U.S.C. 154(b) by 0 days.

(21) Appl. No.: 09/613,769

(22) Filed: Jul. 11, 2000

(51) Int. Cl.⁷ ............................................. H01L 27/10
(52) U.S. Cl. .................... 257/202; 257/206; 257/207; 257/209; 257/210; 257/208
(58) Field of Search ................. 257/206, 202, 257/210, 207, 209

(56) References Cited

U.S. PATENT DOCUMENTS

| | | | |
|---|---|---|---|
| 5,185,283 A | * | 2/1993 | Fukui et al. ............... 437/42 |
| 5,404,033 A | | 4/1995 | Wong et al. |
| 5,565,758 A | | 10/1996 | Yoeli et al. |
| 5,612,553 A | * | 3/1997 | Arakawa ................... 257/206 |
| 5,652,441 A | | 7/1997 | Hashimoto et al. |
| 5,671,397 A | | 9/1997 | Crafts |
| 5,793,068 A | | 8/1998 | Mahant-Shetti |
| 6,188,091 B1 | * | 2/2001 | Young ...................... 257/209 |

FOREIGN PATENT DOCUMENTS

| | | |
|---|---|---|
| JP | A-58-66343 | 7/1983 |
| JP | A-6-112450 | 4/1994 |

* cited by examiner

Primary Examiner—Hoai Ho
Assistant Examiner—Thao P Le
(74) Attorney, Agent, or Firm—Oliff & Berridge, PLC

(57) ABSTRACT

A basic cell is disclosed, which is small in area and has sufficient connection flexibility. for achieving a semiconductor integrated circuit with a higher density and a reduced manufacturing cost. In a basic cell, a terminal wire, which is connected to a transistor terminal with a contact, is placed in a first metal wiring layer, and a plurality of terminal wire connection points, which can be connected to a second metal wire through a first via, are provided on the terminal wire. Further, in a semiconductor integrated circuit, a circuit wire in a second metal wiring layer is placed along grid points with a fixed pitch, and is connected to a terminal connection point of a transistor terminal, which is displaced from the grid points, through a terminal wire provided in the first metal wiring layer.

20 Claims, 17 Drawing Sheets

Prior Art

Prior Art

Prior Art

Prior Art

SEMICONDUCTOR INTEGRATED CIRCUIT BASIC CELL SEMICONDUCTOR INTEGRATED CIRCUIT USING THE SAME

BACKGROUND OF THE INVENTION

1. Field of Invention

This invention relates to a small area basic cell used in semiconductor integrated circuit.

2. Description of Related Art

There are several kinds of semiconductor integrated circuits. More particularly, Application Specific Integrated Circuits (ASIC), whose design is based on functions required by a user, includes gate array and cell-based schemes. In gate array semiconductor integrated circuits, a master slice is manufactured in advance which is common up to a transistor forming process. Then, it is customized at a metal wiring process depending on functions required by a user to provide a user-desired semiconductor integrated circuit in a reduced time and cost. The master slice includes a cell array, in which basic cells are regularly arranged in an array, on a surface of a semiconductor substrate. Here, the basic cell includes a plurality of transistors as basic units.

In this customizing scheme, photomasks designed and produced depending on functions needed by a user are used for the metal wiring processes. The gate array scheme also includes another customizing scheme where connections between the basic units are changed by using an energy beam such as a laser beam.

In the cell-based scheme, customization is implemented from transistor forming processes in order to provide a high density and high performance semiconductor integrated circuit. In this case, standard cells such as basic gates and a flip-flop, macro cells such as a memory and a multiplier, and/or mega cells such as a CPU and a DSP core, are designed and prepared in a cell library in advance, and then are combined in order to design an integrated circuit, which implements functions needed by a user.

Other kinds of ASICs include a Programmable Logic Device (PLD) such as a Field Programmable Gate Array (FPGA), and a Complex Programmable Logic Device (CPLD). In PLDs, a product manufactured according to a certain specification is purchased by a user and programmed according to functions needed by the user. In FPGAs, an array of programmable basic cells (also called Programmable Logic Elements, Configurable Logic Blocks, or the like) and programmable wiring are formed on a semiconductor substrate and programmed by a user.

FIG. 15 shows a plan view of a layout of an exemplary basic cell used in a conventional gate array integrated circuit. As shown, three basic cells 72 (cells 72a, 72b and 72a are shown) having the same configuration are arranged in line in the lateral direction of the figure. Each of basic cells 72 includes four P-type transistors 12 (including two large transistors 12a and two small transistors 12b), and two N-type transistors 14. The p-type transistors comprise a P-type active region 16, which is formed within an N-well (not shown) on a surface of the semiconductor substrate, and two common gate electrodes, 20a and 20b, which are placed over the P-type active region 16. The N-type transistors 14 comprise an N-type active region 18, which is formed within a P-well (not shown) and two common gate electrodes, 20a and 20b, which are placed over the N-type active region 18. On both sides of the gate electrodes of the P-type and N-type active regions are formed N-type and P-type diffusion regions, respectively. Those diffusion regions form sources and drains of the transistors.

On the surface of the active region, which is overlapped with the gate electrode, is formed a channel of the transistor. The width and length of the gate electrode in the area overlapping the active region determine a channel length and a channel width of the transistor. Usually, the width of the gate electrode in this area, which determines the channel length of the transistor, is formed to be a minimum width, which may be manufactured by a process technology used to manufacture the semiconductor integrated circuit. A current driving capacity of the transistor is determined by a ratio of the channel width and the channel length. Because the channel length is determined by the process technology to be used, it is necessary to increase a dimension of the active region in the direction where the gate electrode extends (the dimension in the vertical direction in the case of the basic cell in FIG. 15) and to increase the channel width. It increases the driving capacity of the transistor and provides a semiconductor integrated circuit which can operate with a higher frequency.

In the plane view layout of FIG. 15, a power supply line 24 is placed on the upper side of the P-type transistors 12a, 12b, and a ground line 26 is placed on the lower side of the N-type transistor 14 in the lateral direction, respectively. The power supply line 24 and the ground-line 26 are formed in the first metal wiring layer (M1). The power supply line 24 is used for supplying a power supply potential to the transistors. The ground line 26 is used for supplying a ground potential to the transistors. Though not shown, a power supply potential and a ground potential are also supplied to the N- and P-wells.

The power supply line 24 and the ground line 26 (referred to together as "power bus wiring" hereinafter) have not formed yet in the master slice where processes up to the transistor forming process have been completed. However, the power bus lines are also parts of the basic cell in that they are formed in the same pattern regardless of the function needed by a user.

Further, in the basic cells 72a, 72b, two N-type transistors 22 are placed on the lower side of the ground line 26.

Cross symbols (+) shown in FIG. 15 indicate boundaries between basic cells. As shown, the basic cells 72a and 72b form a layout where they are mirror-inverted with respect to a vertical boundary line. They have the same configuration in that they include the same number of transistors having the same dimensions (channel widths and channel lengths) and conductive types. In a practical case, basic cells, which are mirror-inverted in the vertical direction as well, are placed to form a cell array.

Black dots (•) shown are grid points 34 provided with a fixed pitch in the lateral and vertical directions. The grid points 34 are virtual points, which are used as a reference for positioning various components. Such points do not exist in an actual semiconductor integrated circuit. For example, contacts may be placed on the grid points 34, which are for connecting source and drain diffusion regions and gate electrodes 20a, 20b of the P-type and N-type transistors with wires in M1 layer placed on the interlayer insulating film over the transistors.

The pitch between the grid points is determined by the process technology to be used for semiconductor integrated circuit manufacturing. For example, the distance between centers of two contacts placed on diffusion regions on both sides of the gate electrode must be equal to, or larger than, a value determined by the sum of twice the distance between the gate electrode and the contact, which is needed for preventing a short between the gate electrode and the contact, and a width of the gate electrode and a dimension of a contact. For example, in a manufacturing process with a design rule (generally indicated by a minimum width of a gate electrode) of 0.25 µm, when the gate electrode width and the contact dimension are assumed to be minimum, the minimum distance is 1.04 µM where the gate electrode width, the contact dimension (the length of one side of a square) and the space between the gate electrode and the contact are 0.24 µm, 0.32 µm, and 0.24 µm, respectively.

The pitch of the grid points 34 in FIG. 15 is set to the minimum value of 1.04 µm in order to allow for positioning of the contacts at arbitrary grid points.

Grid points 34 are positioned in the same pitch over a whole area within the cell array region where basic cells 72a, 72b are placed in the vertical and horizontal directions. However, the pitch in the vertical direction between the grid points on the pad at the lower end of the common gate electrodes 20a and 20b and those on the diffusion regions 18 of the N-channel transistor 22 at the bottom are exceptional and set to 1.56 µm.

In the illustrated structure, a plurality of grid points 34 are placed on the source and the drain of two P-type transistors 12a and two N-type transistors 14, respectively. Further, four or five pads 28 are provided for each of the gate electrodes 20a and 20b, which are common to P-type and N-type transistors 12a, 12b and 14. Further, three pads are provided for each of two gate electrodes of the transistors 22. A grid point 34 is placed on each of these pads. It is possible to place contact(s) on either one, or on several, of the plurality of grid point(s) of each of these source and drain regions and the gate electrodes, as needed.

FIG. 16 shows a plane view layout diagram of one example of a circuit block, which includes the basic cells shown in FIG. 15.

An Exclusive-OR (EXOR) gate 74 shown in FIG. 17 is formed by using three basic cells 72a, 72b and 72a shown in FIG. 15 by placing contacts at proper places, connecting them through wires in M1 layer, forming vias in the first via layer (VIAL) at proper places on top surfaces of the M1 wires, and connecting them with wires in the second metal wiring layer (M2) 60 thereabove. In FIG. 16, squares indicate contacts, and ones for connecting vertically and horizontally between them indicates wires of M1 layer. Shaded squares are vias in VIA1 layer (areas where the contacts and VIA1 vias are overlapped are also shaded), and ones for connecting vertically between them are wires of M2 layer.

FIG. 17 shows a circuit diagram corresponding to the above-described layout diagram. Input and output terminals A, B and Y in FIG. 17 are formed in positions with the same reference symbols on the layout of FIG. 16, respectively.

As shown in FIG. 17, the Exclusive-OR gate 74 includes inverters 76a, 76b and 76c, a transfer gate 82a consisting of P-type and N-type transistors 78a and 80a, and a transfer gate 82b consisting of P-type and N-type transistors 78b and 80b. In the layout figure shown in FIG. 16, two inverters 76a and 76b are formed with the right-side basic cell 72, two transfer gates 82a and 82b are formed with the center basic cell, and the inverter 76c is formed with the left-side basic cell, respectively.

A signal A is input to one end of the inverter 76a and the transfer gate 82a, and an output of the inverter 76a is input to one end of the transfer gate 82b. Further, an input signal B is input to the inverter 76b and the gates of the P-type and N-type transistors 78a and 80b, and an output of the inverter 76b is input to the gates of the N-type and P-type transistors 80a and 78b. The other end of the transfer gates 82a and 82b are shorted and input to the inverter 76c, and a signal Y is output from the inverter 76c.

As shown in FIG. 16, positions of contacts on diffusion regions of the transistors 12 and 14 are selected depending on arrangements for connecting each of source/drain diffusion regions of transistors 12 and 14 in order to form a desired circuit block. For example, contact 30 is placed only on the lower one of the two grid points 34 provided on each of the diffusion regions on the right-hand side of the common gate electrode 20a and that between two common gate electrodes 20a and 20b of the P-type transistor 12a in the basic cell 72b at the center of FIG. 16. A M1 wire not connected to any of these diffusion regions is extended over the upper ones of the grid points on which no contact is placed.

Also, the positioning of contacts 30 on pads 28 for the gate electrodes 20a and 20b are selected depending on an arrangement for connecting each transistor. For example, only a pad 28 at the lower side of the ground line 26 is selected to place a contact 30 for the left common gate electrode 20b of the transistors 12 and 14 of the center basic cell 72b. Contacts 30 are not placed on three pads 28 on the common gate electrode 20b between the P-type and N-type transistors 12 and 14. Wires in M1 layer 32, which are not connected to the gate electrode 20b, are placed over these pads 28 to achieve required connections between transistors.

In the circuit diagram of the example above, the EXOR gate 74 also includes vias in VIA1 layer 58 and wires in M2 layer 60. The contact 30, VIA1 58, and M1 wire 32 and M2 wire 60 are all placed on the grid points 34 with a predetermined pitch. As described below, M2 wires 60 are used also as wires for connecting between circuit blocks. Therefore, the number of M2 wires 60 within the circuit block, such as shown in FIGS. 16 and 17, is preferably minimized to increase the flexibility of wiring between blocks.

In an integrated circuit with the conventional basic cells 72, only some of the pads 28 on the common gate electrodes 20a and 20b are used to place the contact 30, and the other pads 28 are not used. Nevertheless, in a conventional semiconductor integrated circuit, a plurality of pads 28 are provided for each of the common gate electrodes 20a and 20b in order to make necessary connections to form a circuit using a limited number (e.g., two layers) of metal wires. That is, in the conventional semiconductor integrated circuit, the common gate electrode with a plurality of contact pads is also utilized to connect between transistors. For example, in the circuit block shown in FIG. 16, the pad 28 at the lower side of the ground line 26 is selected to place the contact 30 of the left gate electrode 20b of the transistors 12 and 14 in the center basic cells 72. Then, connections from the contact to the gate of the P-type transistors 12, as well as the connection to the gate of the N-type transistor 14, are made through the common gate electrode 20a.

Thus, in the conventional basic cell, a plurality of positions where contacts can be placed, are provided for each of the source, the drain and the gate electrodes in order to preserve flexibility of connection. Also, providing a plurality of pads on the common gate electrodes allows the common gate electrode to connect between transistors, which reduces the number of metal wires needed. If only one contact placement position is provided for the respective source, drain and the gate electrodes, or if a plurality of contact placement positions are provided, but the number of the positions are not sufficient, connections between transistors cannot be achieved. As a result, the number of transistors that cannot be used is increased, and the efficiency of transistor utilization is lowered, resulting in an increase in the chip area size of the semiconductor integrated circuit.

On gate electrode pads 28, which are not used to place contact 30, M1 wires 32 may be placed. However, the surface area of the semiconductor substrate on which the pad 28 is provided cannot be utilized as a channel region of a transistor, which produces circuit current. Therefore, extra areas, which correspond to pad regions, are needed in the conventional basic cell 72, which increases the size of the semiconductor integrated circuit. Thus, the number of LSI chips which can be manufactured on one silicon wafer is reduced, and the cost of the LSI chip is increased.

The description above is an example of an EXOR gate circuit block 74. A number of circuit blocks including circuit blocks other than the EXOR gate 74 are formed on a LSI chip using M1 and M2 wires 32 and 60. Further, those circuit blocks are connected between them by using wires up to M2 or the third metal wiring layer (M3), or by also using wires in higher metal layers, and a whole LSI chip with desired functions is formed.

FIG. 18 is a layout diagram showing an example of conventional wiring connections between circuit blocks. FIG. 18 shows a schematic drawing of connections between circuit blocks in an LSI chip manufactured with two layers of metal wires. Wires in M1 layer are used mainly as wires in the lateral direction, while M2 wires 60 are used mainly as wires in the vertical direction, in FIG. 18.

The rectangles in FIG. 18 represent circuit blocks of various kinds. Each circuit block is formed by connecting transistors in one basic cell, or in a plurality of basic cells, arranged in the lateral direction with M1 and M2 wires. The transistors and wires within the basic cells are not shown in the figure. In FIG. 18, two groups of circuit blocks, each of which are arranged in the lateral direction, are provided. There is a region without a circuit block between them. In reality, basic cells are arranged in the lateral and vertical directions to form a cell array including the regions where circuit blocks are not placed, and it is possible to form circuit blocks at an arbitrary position within the cell array. However, in the example shown in FIG. 18, every other row of basic cells is not used to form circuit blocks to provide regions where wires for connecting between circuit blocks are placed (channel region).

In the semiconductor integrated circuit using the basic cells 72 of the conventional example shown in FIGS. 16 and 18, contacts and vias for connecting within blocks or between blocks are placed on the grid points 34. Further, wires in M1 and M2 layers 32, 60 are placed on virtual lines which connects between grid points 34 vertically and laterally (called "grid line" hereinafter). Specifying places where the contacts, the vias and the wires are placed as such allows quick and easy design works for forming circuit blocks and for connecting the circuit blocks on a CAD (Computer Automated Design).

In the semiconductor integrated circuit using the conventional basic cells 72 shown in FIGS. 16 and 18, the pitch between grid points 34 is determined by a dimension of a position where the widest pitch is needed, or, more specifically, by a distance between contacts placed on diffusion regions on both sides of the gate electrode. In some manufacturing processes, it may be determined by a position other than that described above, such as a distance between contacts placed on diffusion regions on both sides of an isolation region. In either case, the grid point pitch is determined by a portion where the widest pitch is needed in the manufacturing process to be used. As a result, simply by placing contacts, vias or wires on the grids, sufficient pitches are ensured between individual contacts, vias or wires each other. Thus, acceptability of the positioning of various features does not have to be considered for each case, which allows designing in a short period of time.

However, as a result, the pitch is increased more than necessary in positions other than the above-described position, which determines grid point pitch. For example, in the semiconductor integrated circuit shown in FIGS. 16 and 18, the pitch between M1 wires and M2 wires is larger than the minimum pitch acceptable by the manufacturing process.

Thus, the pitch between metal wires in the semiconductor integrated circuit using the conventional basic cells 72 is larger than the minimum metal wire pitch which can be manufactured. As a result, areas of circuit blocks and, further, the area of a whole LSI chip, are increased, which reduces the number of LSI chips that can be manufactured on a silicon wafer.

SUMMARY OF THE INVENTION

It is an object of this invention to provide a basic cell and a semiconductor integrated circuit, which can overcome problems of the above-described conventional technology, and reduce manufacturing cost by reducing the area and increasing the density of a LSI chip.

According to one aspect of the invention, an exemplary basic cell of a gate array semiconductor integrated circuit comprises: a plurality of transistors arranged on a semiconductor substrate, the transistors including a plurality of terminals; and a plurality of terminal wires connected to the terminals of the transistors at terminal connection points and arranged in at least one first wiring layer over the semiconductor substrate, the terminal wires having thereon a plurality of terminal wire connection points for connecting with circuit wires to be formed in at least one second wiring layer above the first wiring layer. At least one of the terminal wires is connected to one or more of the terminals at only one of the terminal connection points and has thereon at least two of the terminal wire connection points.

Preferably, at-most one of the terminal connection points is provided for each of the terminals of the transistors. Preferably, the at least two of the terminal wire connection points of the at least one of the terminal wires are arranged two-dimensionally. Preferably, the circuit connection points are arranged on grid points with a fixed pitch, and at least some of the terminal connection points are displaced from the grid points. Preferably, the first wiring layer is a low resistance metal wiring layer.

According to another aspect of the invention, an exemplary semiconductor integrated comprises: a cell array including a plurality of basic cells, each of the basic cells including a plurality of transistors arranged on a semiconductor substrate and a plurality of terminal wires formed in at least one first wiring layer over the semiconductor substrate, the transistors having a plurality of terminals and the terminal wires being connected to the terminals at terminal connection points; and a plurality of circuit wires formed in at least one second wiring layer above the first wiring layer, and connected to respective terminal wires. The terminal wires have thereon a plurality of terminal wire connection points for connecting with the circuit wires, and at least one of the terminal wires is connected to at least one of the terminals of the transistors at only one of the terminal connection points and has thereon at least two of the terminal wire connection points.

Preferably, the circuit wires are arranged along grid points with a fixed pitch, and at least some of the terminal connection points are displaced from the grid points.

According to another aspect of the invention, an exemplary method of increasing flexibility of connection to transistor terminals, comprises: arranging terminal wires connected at terminal connection points to terminals of transistors formed on a semiconductor substrate, the terminal wires are formed in at least one first wiring layer over the semiconductor substrate, at least one of the terminal wires is connected to one or more of the terminals at only one of the terminal connection points; and providing a plurality of terminal wire connection points on the terminal wires for connecting with circuit wires to be formed in at least one second wiring layer above the first wiring layer such that the at least one of the terminal wires has at least two of the terminal wire connection points.

Preferably, the plurality of terminal wires connection points are provided such that at least one of the terminal wire connection points are provided for each of the terminals of the transistors.

According to another aspect of the invention, an exemplary semiconductor integrated circuit comprises: a cell array area including an array of basic cells arranged on a semiconductor substrate, each of the basic cells including a plurality of transistors having a plurality of terminals and a plurality of terminal wires formed in at least one first wiring layer over the semiconductor substrate, the terminals of the transistors having thereon terminal connection points; and a plurality of circuit wires formed in at least one second wiring layer above the first wiring layer, each of the circuit wires having at least one circuit connection point arranged on grid points. At least one of the terminal connection points is displaced from the grid points, and the displaced terminal connection point is connected to one of the circuit connection points through the corresponding terminal wire.

Preferably, each of the terminal wires is connected to only one of the terminal connection points. Preferably, the terminal connection points are connected to the respective circuit connection points always through the respective terminal wires.

Preferably, the terminal wires have thereon terminal wire connection points arranged on the grid points, and the connection between the displaced terminal connection point and the corresponding circuit connection point is formed by connecting corresponding one of the terminal wire connection points to the circuit connection point located above the corresponding terminal wire connection point. Preferably, at least one of the terminal wires connected to the at least one displaced terminal connection point has thereon a terminal wire connection point displaced from the grid points; and the connection between the displaced terminal connection point and the corresponding circuit connection point is formed by connecting the displaced terminal wire connection point to the corresponding circuit connection point through a terminal wire connection element extending in the second wiring layer between a position above the displaced terminal wire connection point to the corresponding circuit connection point.

Preferably, the transistors in each of the basic cells include gate electrodes generally extending in a first direction and arranged in a second direction perpendicular to the first direction, and the displaced terminal connection point is displaced from the grid points at least in the second direction.

According to another aspect of the invention, an exemplary method of connecting to transistor terminals, comprises: arranging basic cells on a semiconductor substrate, each of the basic cells including a plurality of transistors having a plurality of terminals and a plurality of terminal wires formed in at least one first wiring layer over the semiconductor substrate, the terminals of the transistors having thereon terminal connection points; placing a plurality of circuit wires in at least one second wiring layer above the first wiring layer, each of the circuit wires having at least one circuit connection point arranged on grid points; and connecting the terminal connection points to the circuit connection points through the respective terminal wires, wherein at least one of the terminal connection points is displaced from the grid points.

Preferably, the connecting the terminal connection points is performed such that connections between the terminal connection points and the circuit connection points are always formed through the respective terminal wires.

According to another aspect of the invention, an exemplary semiconductor integrated circuit comprises: a cell array including a plurality of basic cells arranged on a semiconductor substrate along a first direction with a pitch $P_c$, each of the basic cells including a plurality of transistors; and a plurality of circuit wires over the cell array, the circuit wires being placed on grid lines perpendicular to the first direction, the grid lines being arranged with a pitch $P_w$ in the first direction, wherein $P_c$ is not an integral multiple of $P_w$, and $P_c \times n$ is equal to $P_w \times m$, and where each of m and n is an integer greater than one.

Preferably, each of the basic cells includes k gate electrodes generally extending perpendicular to the first direction and arranged in the first direction, where k in an integer greater than one, and m is greater than $(k+1) \times n$.

According to another aspect of the invention, an exemplary semiconductor integrated circuit comprises: a cell array including a plurality of basic cells arranged on a semiconductor substrate along a first direction, each of the basic cells including a plurality of transistors; a plurality of circuit wires over the cell array, the circuit wires being placed on grid lines perpendicular to the first direction, wherein the grid lines have a fixed pitch in the first direction, and include cell grid lines above the basic cells and boundary grid lines above boundaries between the basic cells.

Preferably, each of the basic cells includes k gate electrodes generally extending to a second direction perpendicular to the first direction and arranged in the first direction, where k is an integer greater than one, and the cell grid lines include at least k+1 cell grid lines arranged over each of the basic cells.

Preferably, the plurality of basic cells includes two adjacent basic cells arranged on both sides of one of the boundary grid lines; and the circuit wires are formed in at least one first wiring layer, and each of the adjacent basic cells includes a buried wire formed in at least one second wiring layer below the first wiring layer, the buried wire is not connected to the transistors within the respective basic cells, wherein the buried wires of the adjacent basic cells are coupled to extend across the adjacent basic cells.

According to another aspect of the invention, an exemplary semiconductor integrated circuit comprises: a cell array including a plurality of basic cells arranged on a semiconductor substrate along a first direction, each of the basic cells including a plurality of transistors; a plurality of circuit wires formed in at least one first wiring layer, the circuit wires including a boundary circuit wire placed over a boundary between two adjacent ones of the basic cells and a cell circuit wire over each of the adjacent basic cells; and each of the adjacent basic cells further including a buried wire formed in at least one second wiring layer below the first wiring layer, the buried wires are not connected to the transistors within the respective basic cells. The buried wires in the adjacent basic cells are coupled to extend across the adjacent basic cells, and the cell circuit wires over the adjacent basic cells are connected through the buried wires without connecting to the boundary circuit wire.

Preferably, the circuit wires are placed on grid lines perpendicular to the first direction, and the grid lines are arranged with a fixed pitch in the first direction.

In this invention, the term "transistor terminal" means a gate, a source or a drain terminal of a transistor. The term "terminal connection point" means a position on the terminal where a contact can be placed.

A terminal wire is formed in at least one wiring layer above the transistor, like the first metal wiring layer (M1), for example, and functions for pulling out the transistor terminal. The terminal wire connection point is a position where a via in the first via layer (VIA1), for example, can be placed.

A circuit wire is formed in one or more wiring layers above the terminal wire, like the second metal wiring layer (M2), the third metal wiring layer (M3) and above, for example, and forms a circuit by connecting between transistors.

The terminal wire is formed in a fixed pattern as an element for forming a basic cell. The circuit wire is customized depending on the functions that are needed.

The circuit connection point is a position on the circuit wire that can be connected to a via connecting the terminal wire and the circuit wire, like the via in VIA1 layer, for example. A terminal wire connection element is a wire element formed in the same layer as the layer used for the circuit wire. When a circuit connection point on the circuit wire is not exactly above the terminal wire connection point, which should be connected, the terminal wire connection element is extended from a position over a via placed at the terminal wire connection point to the circuit connection point in order to connect the circuit connection point to the via.

A basic cell according to the present invention is typically a basic cell for a gate array semiconductor integrated circuit. In this case, a plurality of basic cells having an identical configuration are arranged in an array and a cell array is formed. Then, circuit wires in two or more layers of metal wires are placed over a cell array region where the cell array is placed, and various kinds of circuit blocks are formed. Then, the circuit blocks are connected in order to form a semiconductor integrated circuit having the functions that are needed by a user. It is possible to form a semiconductor integrated circuit only with circuit blocks formed with basic cells according to this invention. It is also possible to form a semiconductor integrated circuit by combining circuit blocks formed with basic cells and various kinds of macrocells and/or megacells. In a cell-based semiconductor integrated circuit, it is possible to form at least a part of circuit blocks, which is not prepared in a cell library, by using basic cells.

It is also possible to place a cell array of basic cells according to this invention in a cell-based semiconductor integrated circuit chip. Circuit blocks, which are formed by performing wiring over the cell array region, can be used for a design modification after a transistor forming process, a design change after manufacturing a sample device, or the like.

On the other hand, in an integrated circuit customized by using a laser beam or other energy beam, the basic cell according to this invention may be manufactured by performing manufacturing steps including metal wiring steps. Also, it is possible to use the basic cell of this invention as a programmable basic cell, such as a FPGA.

BRIEF DESCRIPTION OF THE DRAWINGS

Embodiments of this invention will be described with reference to the following figures, in which.

DETAILED DESCRIPTION OF PREFERRED EMBODIMENTS

Figure 1:
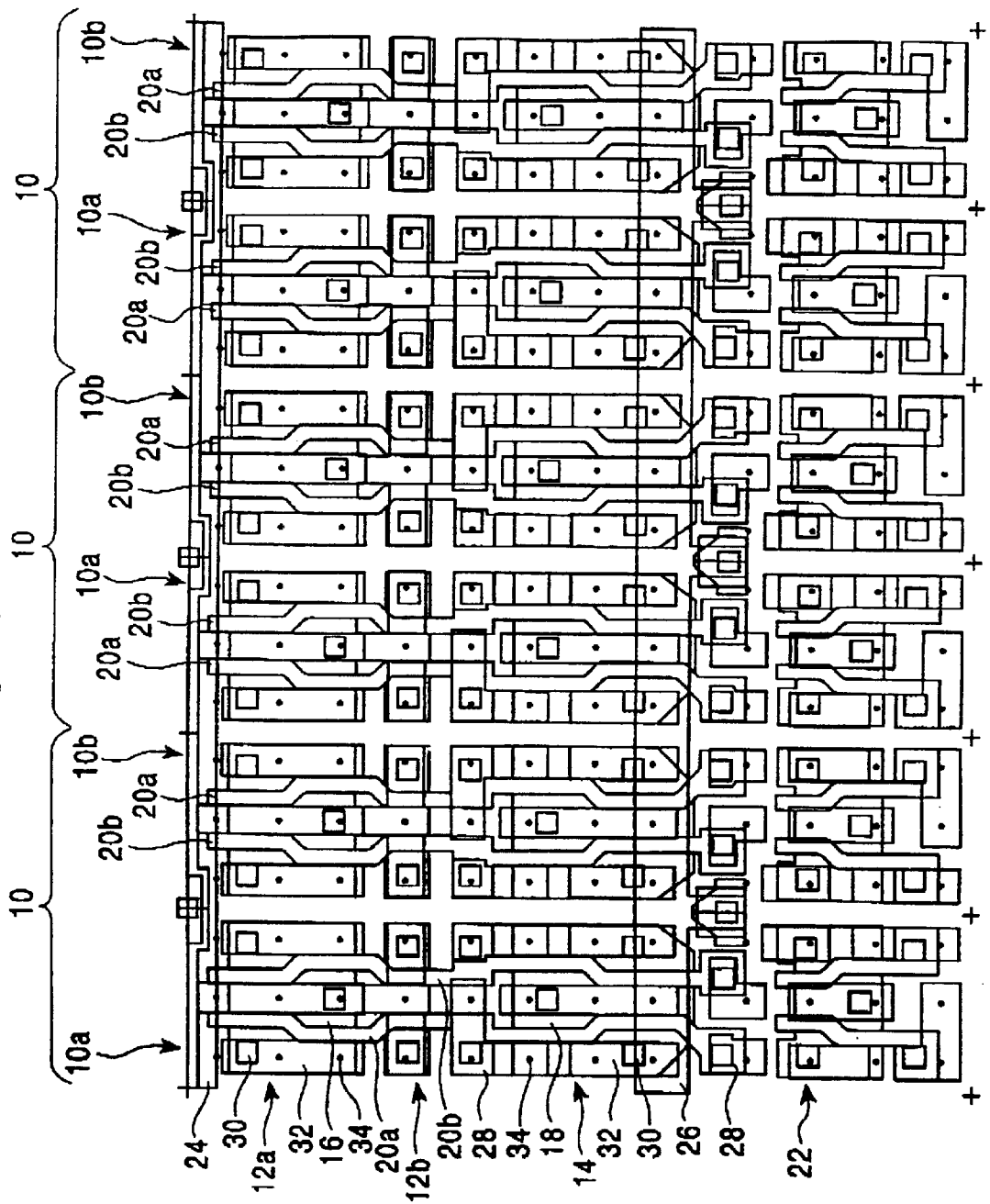
FIG. 1 is a layout diagram of an example of basic cells of this invention.

This invention was first described in Japanese Patent Applications Nos. 11-203207 and 11-203207, each hereby incorporated by reference in its entirety.

Basic cells and semiconductor integrated circuits according to this invention will be described below with reference to preferred embodiments shown in the drawings.

FIG. 1 is a layout diagram of one example of basic cells of the present invention.

Figure 15:
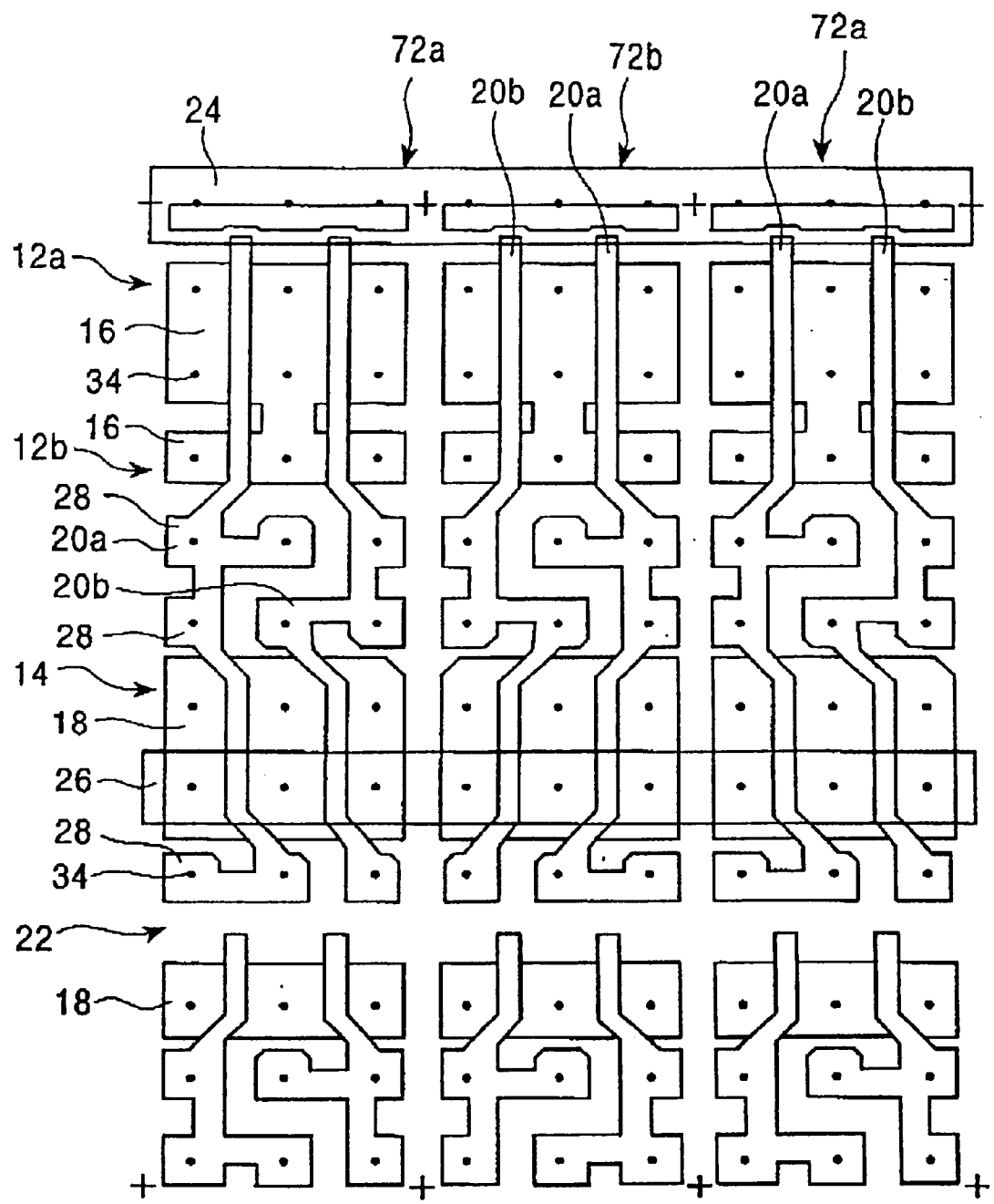
FIG. 15 is a layout diagram of an example of conventional basic cells.

The basic cell illustrated is used in a gate array semiconductor integrated circuit and has the same number of the same conductive types of transistors as those of the conventional basic cell shown in FIG. 15. When two basic cells 10a and 10b, which are mirror-inverted laterally in FIG. 1, are considered as one set, a total of three sets, that is, six basic cells 10, are arranged laterally in FIG. 1. In reality, basic cells, which are mirror-inverted vertically, are also combined and arranged vertically to form a cell array. FIG. 1 shows a layout of a cell array including a plurality of basic cells 10 before being customized, which has been formed by manufacturing steps of active layer forming, gate electrode forming, contact forming and M1 wire forming. In this stage, it is manufactured by using a certain predesigned pattern, not depending on the functions needed by a user. However, in FIG. 1, power bus wires to be formed in M2 wiring layer are also shown.

Each of the basic cells 10 (10a, 10b) includes, in order from the top of FIG. 1, two P-type transistors 12a and two P-type transistors 12b with a channel width less than that of 12a (i.e., four P-type transistors 12 in total), and two N-type transistor 14. On P-type and N-type active regions 16 and 18 forming these P-type and N-type transistors 12 and 14 are placed two common gate electrodes 20a and 20b. Each of the common gate electrodes 20a and 20b forms a common gate terminal shared by the two P-type transistors 12a and 12b and a N-type transistor 14. Respective N-type and P-type diffusion regions are formed on both sides of respective gate electrodes in P-type and N-type active regions. These diffusion regions include sources and drains of the transistor. That is, the left diffusion region forms a source or drain terminal of the left side transistor, the right diffusion region forms a source or drain terminal of the right side transistor, and the diffusion region between the two gate electrodes forms a common source or drain terminal shared by the two transistors.

Further, two N-type transistors 22 with a channel width less than that of N-type transistor 14, which is electrically independent from the P-type and N-type transistors 12 and 14, are provided on the lower side of the N-type transistors 14.

A wire (power supply line) 24 in M2 wiring layer for supplying a power supply potential to the transistors is placed laterally on the upper side of the P-type transistors 12a. The power supply potential is supplied to an N well (not shown) through an N-type diffusion layer. Also, a wire (ground line) 26 in the M2 wiring layer for supplying a ground voltage to the transistors is placed laterally on the lower side of the N-type transistors 14. The ground potential is supplied to a P well (not shown) through a P-type diffusion layer.

In each of the basic cells 10, two common gate electrodes 20a and 20b generally extend vertically over the P-type and N-type active regions 16 and 18 with minor bends by 45° to the opposite directions. Contacts for connecting gate electrodes 20a and 20b with another transistor can be placed on pads 28, each of which has one gate terminal connection point. Two of the pads 28 are provided to respective gate electrodes 20a and 20b. In the case of the example illustrated, the pads 28 for the gate electrodes 20a and 20b are provided at two places between P-type and N-type transistors 12b and 14 and between N-type transistors 14 and 22. Further, only one pad is provided for each gate electrode of the transistors 22. The number of these pads is fewer than that of the conventional basic cell 72 shown in FIG. 15.

Reducing the number of pads 28 reduces the surface area of the semiconductor substrate, which do not function as channel regions of transistors, as compared with the conventional basic cell shown in FIG. 15. It allows enhancement of efficiency of surface utilization of the semiconductor substrate. That is, it is possible to reduce the vertical dimension (height) of the basic cell with the same channel widths of the transistors, to increase the channel widths of the transistors with the same height, or to improve a balance between the height of the basic cell and the channel widths of the transistors.

Each of the diffusion regions of transistors 12, 14, and 22 is sized such that only one contact 30 can be placed. That is, they have one terminal connection point each. These diffusion regions are connected through respective one contact 30 to wire 32, which is formed in M1 wiring layer thereabove. In the conventional basic cell shown in FIG. 15, for example, contacts 30 for the diffusion regions of the P-type transistors 12a are placed in line laterally. However, the contacts 30 for the same regions in this case are placed in a vertically shifted configuration in order to allow the lateral dimension (width) of the basic cells 10a and 10b to be reduced. More specifically, when the same 0.25 $\mu$m design rule manufacturing process is assumed to be used, the width of the conventional basic cell in FIG. 15 is 3.12 $\mu$m while the width of the basic cell of the embodiment in FIG. 1 is 2.64 $\mu$m, which equals a reduction of about 15%.

That is, contacts to outer diffusion regions of the P-type transistors 12a are placed on the uppermost portions of the P-type diffusion regions. On the other hand, a contact to a diffusion region between the two common gate electrodes of the same transistors is placed in a position shifted to the lower direction in the figure. In the area where the contacts to the outer diffusion regions are placed, a distance between two common gate electrodes is reduced, and a contact to the diffusion region between the two gate electrodes cannot be placed keeping spaces needed for preventing a short between the gate electrode and the contact. On the other hand, in the area where the contact to a diffusion region between the two gate electrodes is placed, the distance between two gate electrodes is enlarged, and a contact can be placed between them. However, the space between the outer edge of the diffusion region 16 and gate electrodes is narrow and contacts cannot be placed keeping spaces needed for preventing a short against the gate electrode and simultaneously keeping margins needed from the edges of the diffusion regions.

Over each of the pads 28 of the common gate electrodes of the transistors 12, 14 and 22, a wire 32 in M1 wiring layer, which is connected by one contact 30, is placed.

The M1 wire 32 is connected to a corresponding transistor terminal by a contact, and is not connected to other transistor terminals. Therefore, the wire 32 does not form an electrical circuit by itself. A circuit is formed by connecting two of the wires 32, which are formed in M1 wiring layer and connected to different terminals of the transistors, with a wire formed in an upper wiring layer through vias. That is, the wire 32 in M1 wiring layer functions for pulling out the transistor terminal to the M1 layer in order to allow connection with the wire in the upper wiring layer. In this sense, the wire 32, which is formed in M1 wiring layer and connected through a contact to a transistor terminal, is called a "terminal wire". Further, the wire, which is placed in a wiring layer thereabove, for forming a circuit, is called a "circuit wire". In addition, the position on the terminal where the terminal wire 32 is connected by placing a contact 30, is called a "terminal connection point".

The space between two gate electrodes is narrower over the active region of the second P-type transistors 12b. Thus, it is not possible to place a contact on the diffusion region of this transistor between the gate electrodes. A contact and a terminal wire cannot be provided to this part, and a terminal connection point and a terminal wire provided for the diffusion region between the gate electrodes of the first P-type transistors 12a is shared by both of the P-type transistors 12a and 12b.

Black dots (•) in FIG. 1 indicate grid points 34, which represent positions where a via in VIA1 layer can be placed. Wires in M2 and M3 wiring layers are both placed so as to connect between the grid points. Vias in the second via layer (VIA2) for connecting M2 wires and M3 wires are also placed on grid points 34.

The terminal wire 32, which is connected to the diffusion region of the transistors 12, 14 and 22 through the contact 30, includes at least one grid point 34, and, preferably, a plurality of grid points 34, and is formed in a shape where VIA1 can be placed on the respective grid point(s) keeping a margin needed for ensuring the connection to the terminal wire. For example, there are two grid points 34 on each of the terminal wires 32 connected to the source and the drain of the upper P-type transistor 12a. A via in VIA1 layer can be placed on each grid point 34, and two circuit wires formed in M2 wiring layer can be connected to the terminal wire 32 through the respective vias in VIA1 layer. In this sense, a position on the terminal wire where a via in VIA1 layer can be placed is called a "terminal wire connection point". In this example, the terminal wire connection point is on the grid point 34. Also, a position on the circuit wire, which is connected to a transistor terminal through a via and a terminal wire, is called a "circuit connection point". In the basic cell shown in FIG. 1, the circuit connection point is always on the grid point 34.

These points, like the grid points, are also virtual points.

Some of the terminal wires 32, each of which is connected to the corresponding gate electrode pad 28 common to the transistors 12 and 14 through a contact 30, also includes a plurality of terminal wire connection points on which vias in VIA1 layer can be placed. For example, on the terminal wire 32 connected to the pad 28 of the gate electrode 20a between P-type and N-type transistors 12b, 14, three grid points 34 are provided in a two-dimensional (L-shaped) form. There are terminal connection points on these grid points 34.

When a plurality of terminal wire connection points are provided on a terminal wire 32, the grid points 34 may be placed in line either vertically or laterally, or they may be placed on both vertical and lateral lines, that is, two-dimensionally. For example, three grid points 34 on the terminal wire, which is connected to the pad 28 of the common gate electrode 20a between the P-type transistor 12b and the N-type transistor, are placed two-dimensionally, or more specifically in an L-shaped form. The terminal wire 32 connected through one contact 30 to the corresponding terminal may include a plurality of terminal wire connection points, and the plurality of terminal wire connection points may be placed two-dimensionally to enhance the flexibility of connection when forming a desired circuit block with VIA1 vias, M2 wires, VIA2 vias, M3 wires and others.

According to the basic cell of this embodiment, by reducing the number of the connection points of transistor terminals, especially, by reducing the number of pads 28 of the gate electrode, the efficiency of the semiconductor substrate surface utilization can be improved. Also, by connecting the terminal wire 32 to the terminal through one contact 30 and providing a plurality of terminal wire connection points on the terminal wire, the flexibility of connection can be preserved. More specifically, a height of the basic cell 10 of this embodiment is 11.0 $\mu$m, while the height of the conventional basic cell 72 shown in FIG. 15 with the same design rule is 12.24 $\mu$m. Therefore, the height of the basic cell according to this embodiment is about 10% smaller than the conventional basic cell shown in FIG. 15. Further, the area of the basic cell according to this embodiment is 29.04 $\mu m_2$. This is about 24% smaller than 38.19 $\mu m^2$, which is the area of the conventional basic cell in FIG. 15.

In the basic cell in FIG. 1, vertical dimensions of the areas of active regions of P-type transistors 12a and 12b and N-type transistors 14 and 22, that are overlapped with the gate electrode, are 1.78 $\mu$m, 0.64 $\mu$m, 2.52 $\mu$m and 1.16 $\mu$m, respectively. On the other hand, vertical dimensions of respective active regions of transistors 12a, 12b, 14, and 22 of the basic cell 72 in FIG. 15 are 1.68 $\mu$m, 0.64 $\mu$m, 2.24 $\mu$m, 0.92 $\mu$m, respectively. That is, the basic cell 10 of this embodiment is larger in channel widths of the transistors. For example, the vertical dimension of the active region of the N-type transistor 14 is about 13% larger than that of the case shown in FIG. 15. Further, the gate electrode is bent by 45° in the basic cell of this embodiment. Therefore, effective channel width is increased more than the ratio of the vertical dimensions of the active regions.

The pitch between grid points 34 is determined by a process technique to be used for manufacturing the semiconductor integrated circuit. For example, the pitch is equal to a minimum pitch, which can prevent a short between M1 wires where VIA1 vias are provided, and between M2 wires which are connected to different M1 wires through different VIA1 vias. On the other hand, the contacts 30 are placed so as to prevent a short between the gate electrode and the contacts, for example, similar to the case of the conventional basic cell shown in FIG. 15. Therefore, the grid points 34 for VIA1 are not always matched with the positions where contacts can be placed, or the terminal connection points.

Figure 16:
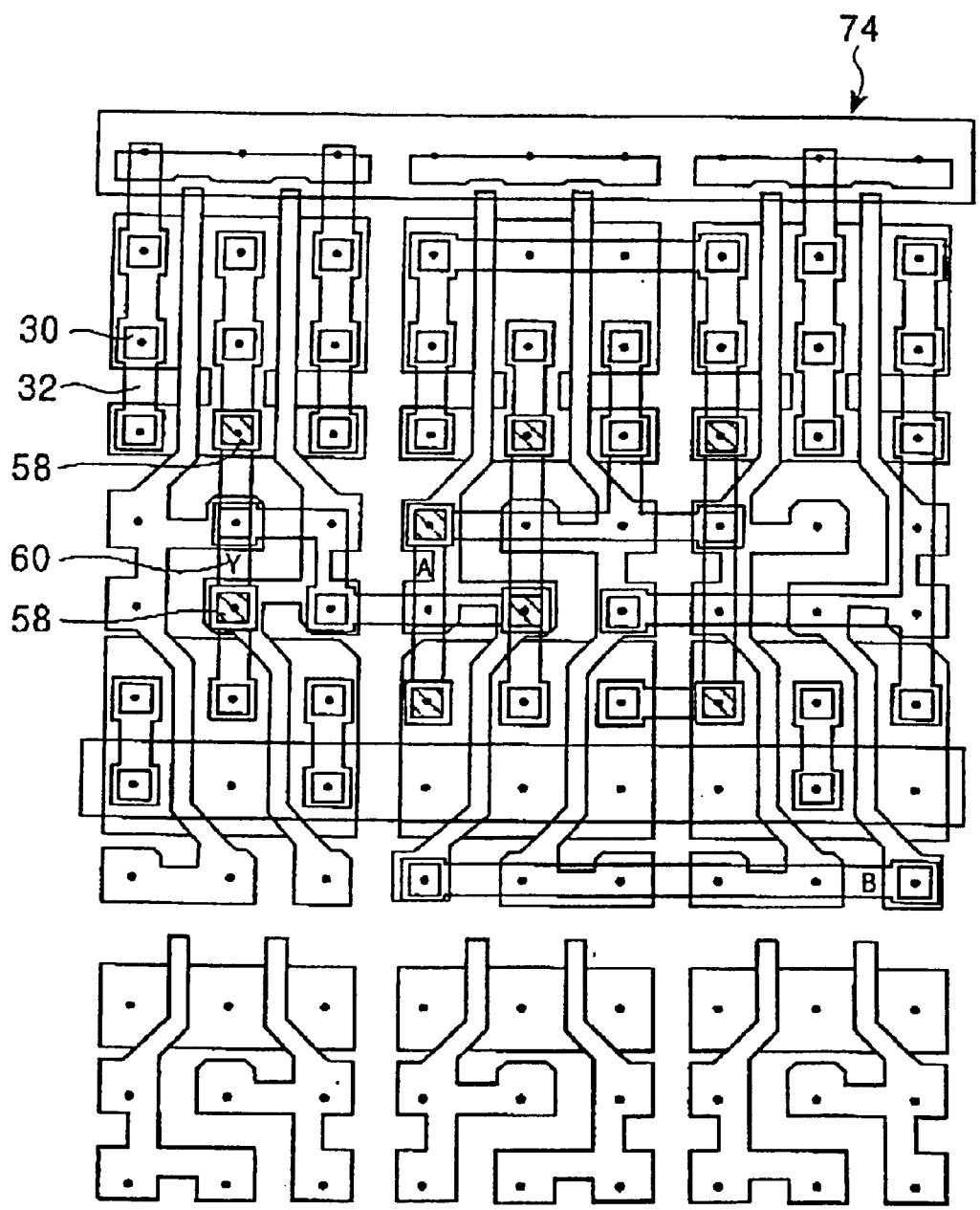
FIG. 16 is a layout diagram of an exemplary circuit block, which includes the conventional basic cells shown in FIG. 15.
Figure 17:
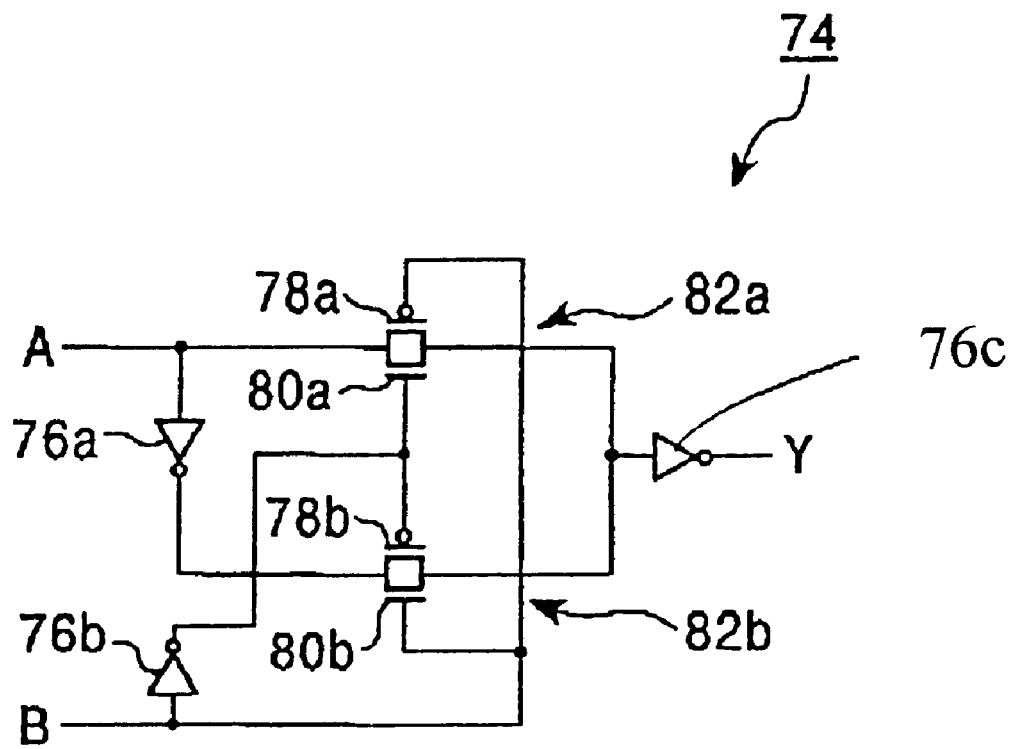
FIG. 17 is a circuit diagram of an exemplary circuit block shown in FIG. 16.
Figure 18:
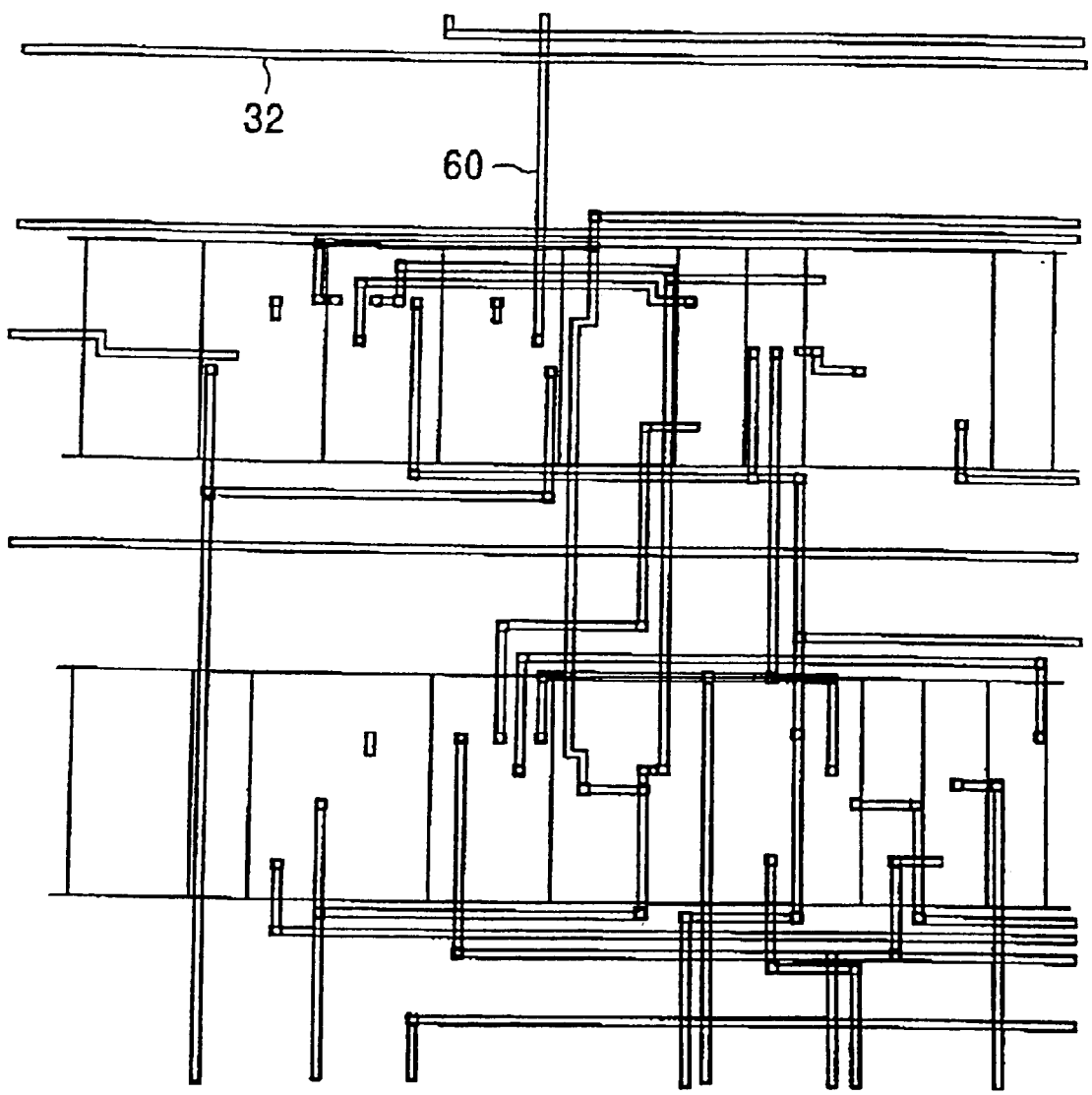
FIG. 18 is a layout diagram of an exemplary wire connection between circuit blocks formed using the conventional basic cells.

As a result, the contact 30 provided for the gate, source or drain terminal of the transistors 12, 14, 22 does not have a fixed positional relationship with the grid points 34 for VIA1 vias on the terminal wire 32 connected to the terminal through the contact 30. That is, the grid points 34 are not always positioned over the center of the contact 30. In the conventional semiconductor integrated circuit as shown in FIGS. 16 and 18, the grid points determined by the distance between placeable contacts 30 also determine positioning of M1 wires, VIA1 vias, M2 wire, and others. On the contrary, in this embodiment, the pitch between grid points 34 where VIA1 vias, M2 wires, VIA2 vias, M3 wire and others are placed is determined independently of the position where the contact 30 is placed. In this embodiment, the transistor terminal and the circuit wire formed in M2 wiring layer or higher wiring layers are connected through the terminal wire 32 provided in M1 wiring layer. Therefore, the pitch between grid points 34 can be set independently of the distance between contacts 30.

More specifically, a grid point pitch of 0.88 $\mu$m, which is about 17% smaller than the grid point pitch in FIG. 16, is achieved, where the same 0.25 $\mu$m design rule manufacturing process is assumed to be used. Here, it is assumed that the dimension of vias in VIA1 and VIA2 layers (side of a square) is 0.36 $\mu$m and the width of wires in M2 and M3 layers is 0.4 $\mu$m.

As a result of the smaller grid pitch for VIA1 layer and above, although the dimension of the basic cell is smaller as described above, the number of M2 wires and M3 wires, which can be placed over the basic cell, is equal to or greater than that of the conventional basic cell 72. That is, the density of the wires is high. More specifically, it is possible to place three and twelve wires vertically and laterally, respectively, over each basic cell. On the other hand, in the case of the conventional basic cell 72 shown in FIG. 15, it is possible to place thereabove three and 11.5 wires vertically and laterally, respectively. Therefore, the number of wires, which can be placed over the basic cell 10 of this embodiment is the same vertically as that in the conventional basic cell 72, while it is about 4% larger laterally. Increasing the wire density as such can allow higher connection density, which enhances the efficiency of the transistor utilization. That is, it can reduce the proportion of transistors, which cannot be used because they cannot be connected, among transistors within a basic cell.

In an advanced semiconductor integrated circuit, not limiting to the gate array semiconductor integrated circuit, the area needed for forming connections for achieving the function generally determines the chip area needed for implementing desired functions. In this invention, increasing the density of wires can reduce the chip area needed for achieving the same function.

Thus, in the basic cell 10 of this invention, grid points 34 are placed independently of the positioning pitch of contacts 30. Connecting between the terminal connection point of the terminal and the circuit connection point of the circuit wire through the terminal wire 32 provided in the M1 wiring layer increases the density of wires, which allows high density circuit blocks as well as a high density LSI chip to be manufactured.

By placing structures needed for circuit formation, including vias in VIA1 and VIA2 and wires in M2 and M3 layers along the grid points 34, design works for forming a circuit block and connecting between the circuit blocks can be performed easily and quickly by making use of an automatic placing and routing function provided by a CAD system. On the other hand, it is difficult to apply an automatic placement by CAD when designing structures that are not placed on the grid points 34, such as contacts 30 and terminal wires 32. However, these design works are performed at a time when the basic cell is designed, and redesigning is not needed when designing an individual LSI for each user. Therefore, it is not a practical problem that the automatic placement cannot be applied to the designing of such parts.

In the case of the example illustrated, the distance between the grid points 34 provided on the ground line 26 and the next grid points 34 below them is 1.32 μm and is different from, or 1.5 times larger than, the pitch between other grid points 34. This is because these grid points 34 are moved so as to connect the ground line 26 to the P well. In this way, it is not always necessary to keep the same pitch between grid points 34, and the grid point 34 may be moved as needed. However, the distance between grid points 34 other than this portion is equal to the fixed pitch of 0.88 μm in both vertical and lateral directions. When a CAD system is used for design, positions of the grid points may be entered into the CAD system in advance such that elements in VIA1 layer, M2 wiring layer and above can be placed automatically on the moved grid point 34.

Figure 2:
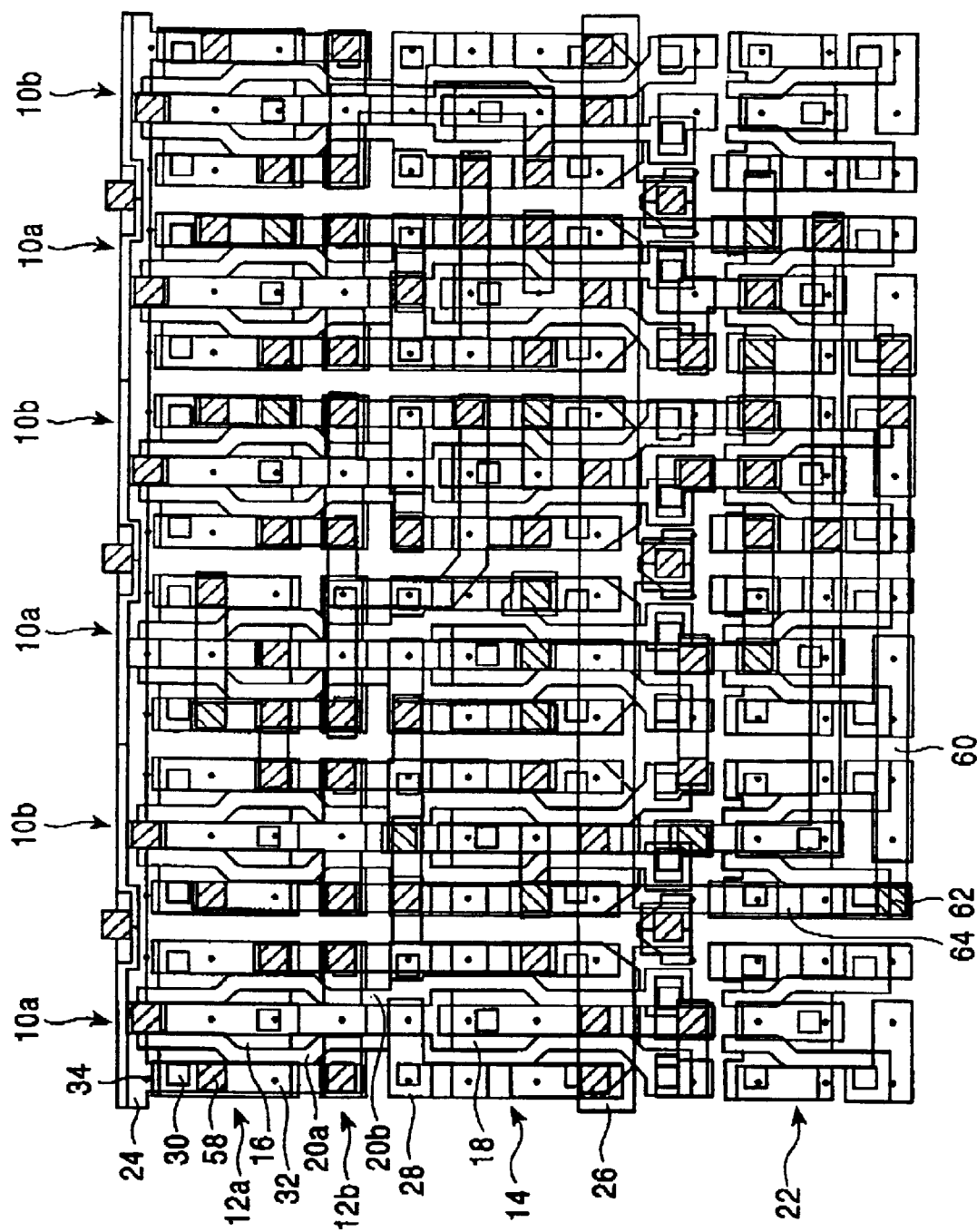
FIG. 2 is a layout diagram of an exemplary circuit block, which includes the basic cells shown in FIG. 1.

FIG. 2 shows a layout diagram of one embodiment of a circuit block including the basic cell of this invention shown in FIG. 1.

As an example of the circuit block, a flip-flop circuit 36 is configured in FIG. 2. The flip-flop circuit 36 is formed by customizing the basic cells 10 (10a, 10b), where elements up to M1 wiring layer are formed, with respective patterns in VIA1, M2, VIA2 and M3 layers. In FIG. 2, shaded squares indicate vias in VIA1 and VIA2 layers, and unshaded squares indicate contacts.

Figure 3:
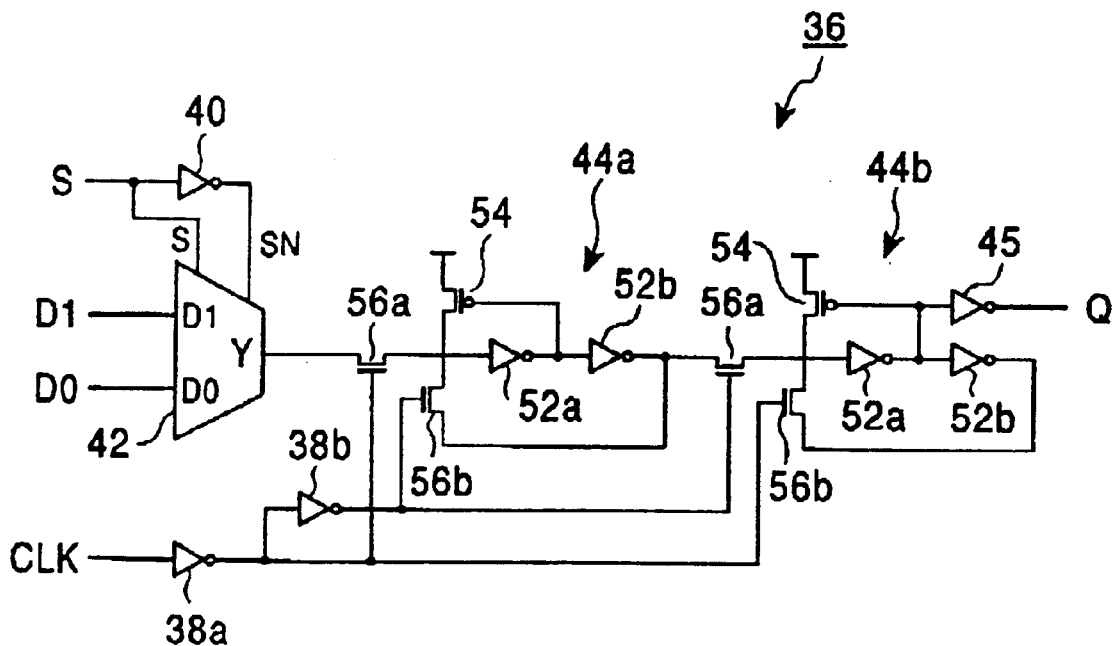
FIG. 3 is a circuit diagram of an exemplary circuit block shown in FIG. 2.

FIG. 3 shows a circuit diagram of one embodiment of the circuit block shown in FIG. 2. As shown in FIG. 3, the flip-flop circuit 36 includes two inverters 38a and 38b to be used as clock buffers, an inverter 40 and a multiplexer 42, master and slave latches 44a and 44b, and an inverter 45 to be used as an output buffer.

Here, two inverters 38a and 38b, which are clock buffers, are serially connected and a signal CLK is input to the first stage inverter 38a.

Figure 4:
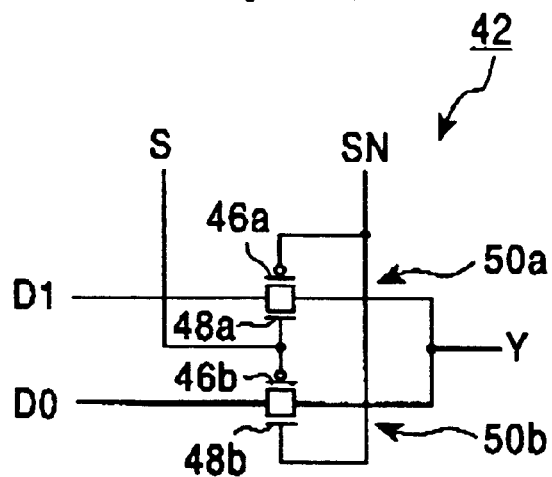
FIG. 4 is a circuit diagram of an exemplary multiplexer shown in FIG. 3.

A signal S is input to the inverter 40 and a signal SN is output from the inverter 40. These signals S and SN are input to S and SN terminals of the multiplexer 42. As shown in FIG. 4, the multiplexer 42 includes a first transfer gate 50a, including P-type and N-type transistors 46a and 48a, and a second transfer gate 50b, including P-type and N-type transistors 46b and 48b.

Signals D1 and D0 are input to one end of respective transfer gates 50a and 50b, and output as a signal Y from the other terminal of the transfer gates 50a and 50b, which are coupled. Further, a signal S is input to a gate of the N-type transistor 48 of the transfer gate 50a and the P-type transistor 46b of the transfer gate 50b. A signal SN is input to a gate of the P-type transistor 46a of the transfer gate 50a and the N-type transistor 48b of the transfer gate 50b.

The master and slave latches 44a and 44b include two inverters 52a and 52b, a P-type transistor 54 and two N-type transistors 56a and 56b, as shown in FIG. 3. In respective latches 44a and 44b, output of the inverter 52a is input to a gate of the P-type transistor 54 and to the next stage inverter 52b. Sources of the P-type and N-type transistors 54 and 56b are connected to the power supply and the output of the inverter 52b, respectively. Drains of these transistors are connected together to the input of the inverter 52a.

The N-type transistor 56a of the master latch 44a is connected between the multiplexer 42 and the inverter 52a and the N-type transistor 56a of the slave latch 44b is connected between the inverter 52b of the master latch 44a and the inverter 52a of the slave latch 44b. Further, an output of the inverter 38a to be used as a clock buffer is input to a gate of the N-type transistor 56a of the master latch 44a and the N-type transistor 56b of the slave latch 44b. An output of the inverter 38b as a clock buffer is input to a gate of the N-type transistor 56b of the master latch 44a and the N-type transistor 56a of the slave latch 44b.

An output from the inverter 52a of the slave latch 44b is input to the inverter 45 as an output buffer, and a signal Q, which is an output of the flip-flop circuit 36, is output from the inverter 45.

Figure 5:
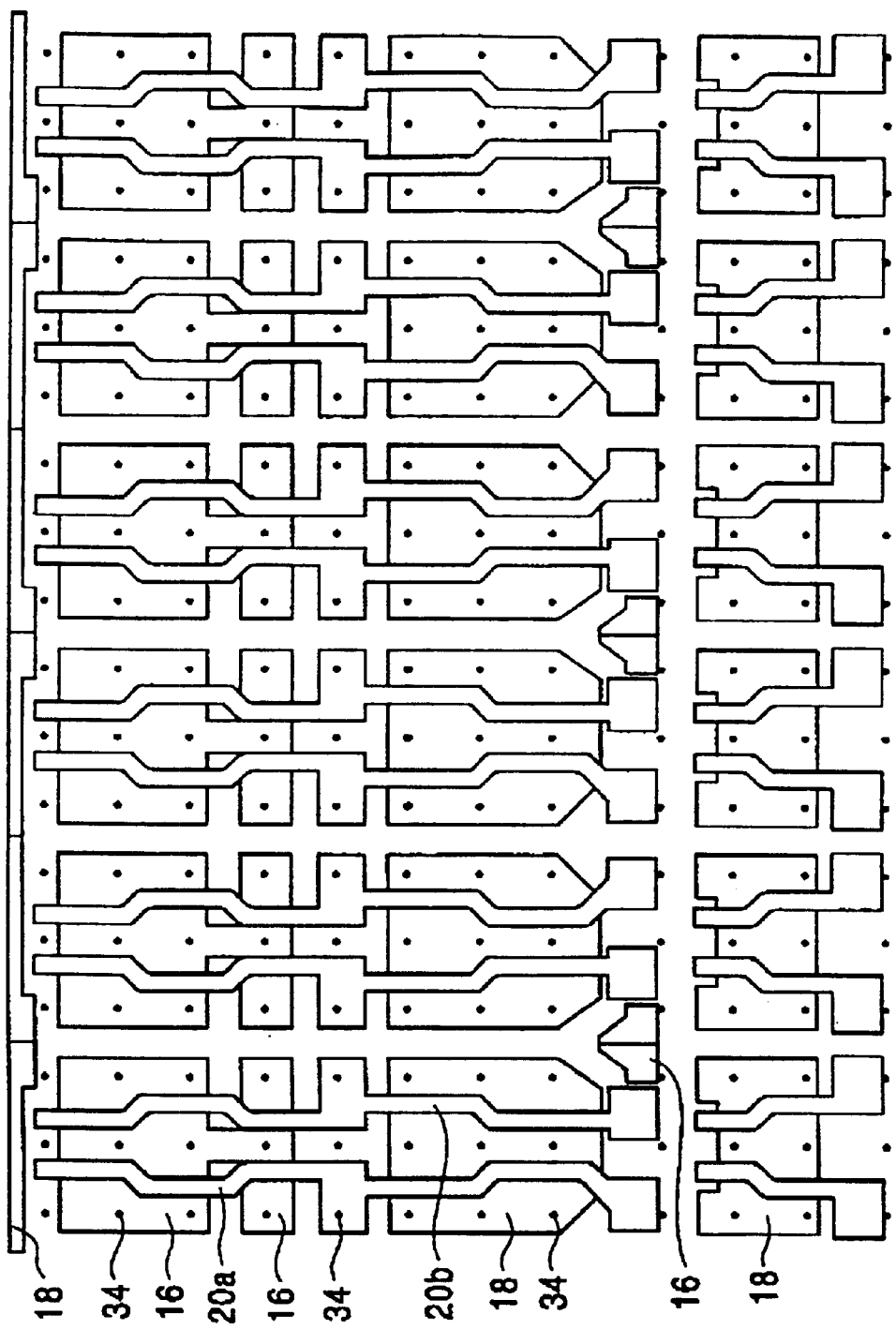
FIG. 5 is a layout diagram of P-type and N-type active layers and a gate electrode layer in the circuit block shown in FIG. 2.
Figure 6:
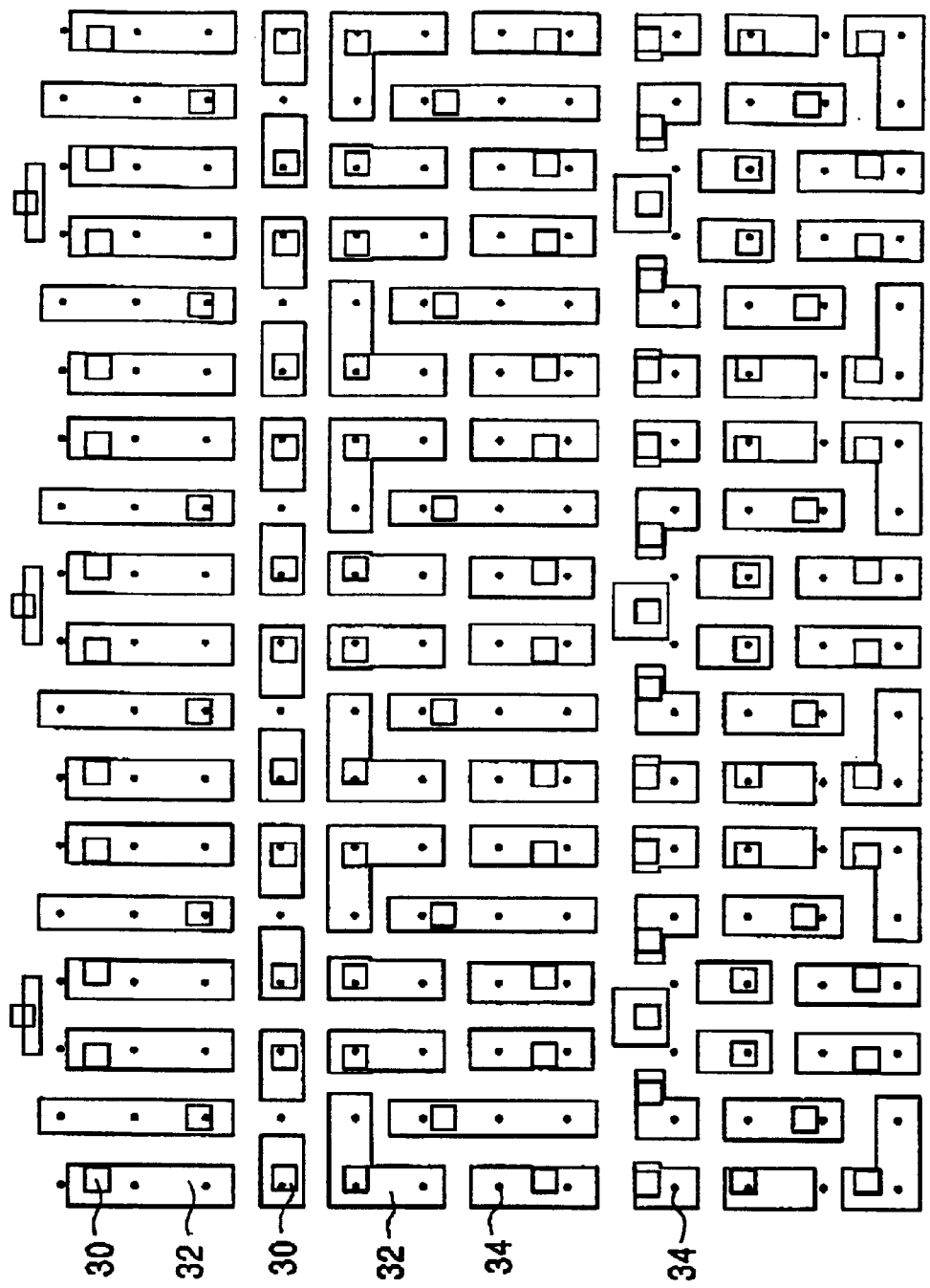
FIG. 6 is a layout diagram of a contact and M1 wiring layers in the circuit block shown in FIG. 2.
Figure 7:
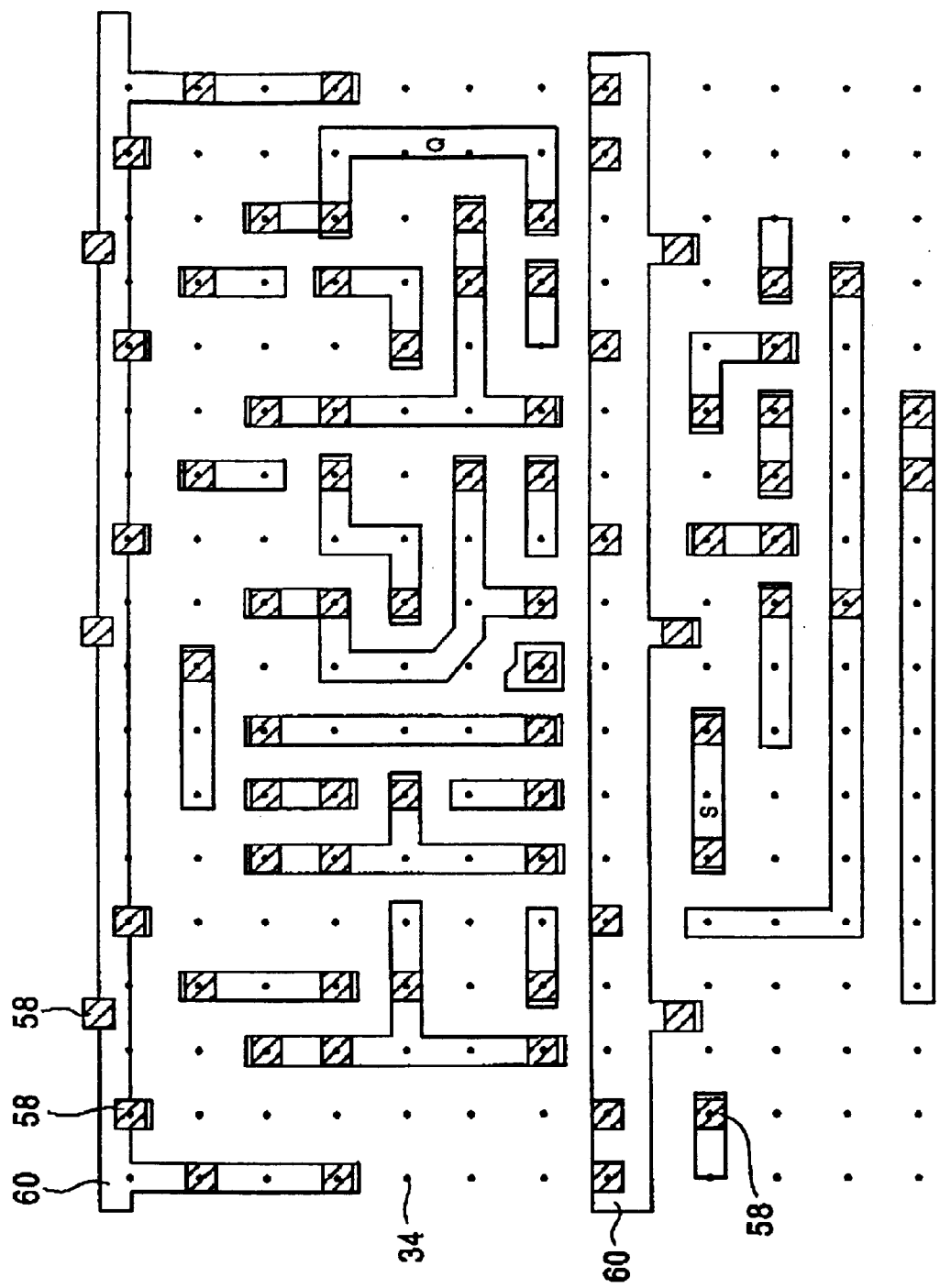
FIG. 7 is a layout diagram of VIA1 and M2 wiring layers in the circuit diagram shown in FIG. 2.
Figure 8:
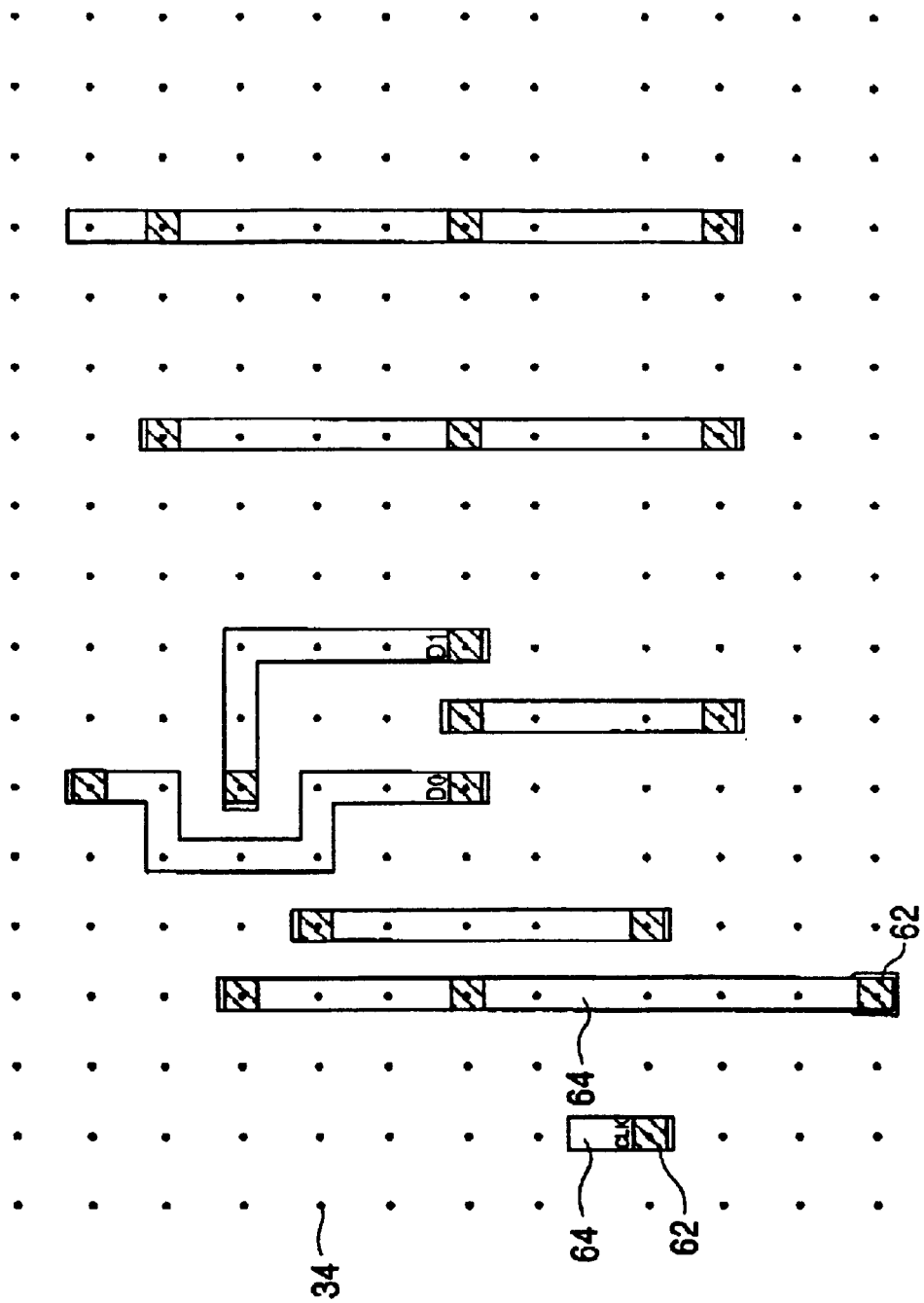
FIG. 8 is a layout diagram of VIA2 and M3 wiring layers in the circuit block shown in FIG. 2.

In order to simplify the comparison between the layout diagram shown in FIG. 2 and the circuit diagram shown in FIGS. 3 and 4, layout diagrams for every two or three layers are shown in FIGS. 5–8. FIG. 5 shows the layout of the P and N active layers including P-type and N-type active regions 16 and 18 and the layout of the gate layer including gate electrodes 20a and 20b. FIG. 6 shows the layout of the contact layer and M1 wiring layer; FIG. 7 shows the layout of VIA1 layer and M2 wiring layer; and FIG. 8 shows the layout of VIA2 layer and M3 wiring layer. Grid points 34 for elements in VIA1 layer and above are also indicated in each of the layout figures. In FIGS. 7 and 8, the positions of the terminals S, D1, D0, CLK and Q shown in the circuit diagram in FIG. 3 are illustrated.

Contacts are indicated by squares in FIG. 6. Many of the contacts are placed at terminal connection points of transistors. Contacts other than those contacts connect wells to power bus wires.

In FIG. 7, a shaded square indicates a via in VIA1 layer. Many of the VIA1 vias are placed on grid points 34 and connect terminal connection points of terminal wires and circuit connection points of circuit wires formed in M2 wiring layer. It should be understood from FIG. 7 that some of VIA1 vias connected to the power bus wires are placed off the grid points 34. These VIA1 vias are used for supplying the power supply potential or the ground potential to the N or a P well. These VIA1 vias are placed when the basic cell is designed.

FIG. 7 shows a plurality of circuit wires, which are formed in M2 wiring layer. These circuit wires are placed along the grid points 34, that is, placed on lines (grid lines), which connect grid points vertically and horizontally. Respective circuit wires of M2 wiring layer have a VIA1 via at one end, or at both ends, and are connected to corresponding terminal wire in M1 wiring layer through the VIA1 via.

A circuit connection point is positioned on the grid points 34. In this embodiment, the terminal wire connection point of the terminal wire is also positioned on the grid points 34. Therefore, a circuit wire is placed such that a circuit connection point is positioned right above a terminal wire connection point of a corresponding terminal wire. A VIA1 via is provided on the grid point 34 where the terminal wire connection point and the circuit connection point are positioned. Thus, the circuit connection point of the circuit wire and the terminal wire connection point of the terminal wire are connected to each other through the VIA1 via.

In practice, an end of the circuit wire where the circuit connection point is provided extends further from the position of the grid point 34 where the circuit connection point is provided. It may be widened as compared to other parts. As a result, a margin, which is needed by a process technology used, is preserved so that the circuit wire contacts over a whole area of the top surface of the VIA1 via.

As seen from FIGS. 6 and 7, the circuit connection point of the circuit wire is often positioned within a range of one grid unit from the terminal connection point to which the circuit wire is connected through a VIA1 via and a terminal wire. That is, the center of the corresponding terminal connection point is located in either one of four squares formed by adjacent grid lines, whose apexes are joined at the grid point 34 where the circuit connection point is positioned. However, a rectangle rather than a square is formed in a part where the vertical pitch between grid points is different.

It is not essential in embodiments of this invention to position the circuit connection point close to the corresponding terminal connection point. However, as described above, the main purpose for having a terminal wire is to adjust the positional difference between a circuit wire placed on the grid points 34 and a terminal connection point located independently of the grid points 34. Therefore, it is not preferable to enlarge the distance between these points. Even when a plurality of terminal wire connection points is provided on a terminal wire, a shorter distance between the terminal wire connection point and the terminal connection point is more preferable, in order to reduce the area of the terminal wire and the capacitance between terminal wires. For example, the terminal wire connected to the pad of the common gate electrode 20a, which is provided between the P-type transistor 12b and the N-type transistor 14, has three terminal wire connection points. All of these terminal wire connection points are located within the range of one grid unit with respect to the terminal connection point of the gate electrode 20a. Therefore, the circuit connection point of the circuit wire, connected to this terminal wire through a VIA1 via positioned at either one of these terminal wire connection points, is located within one grid unit from the corresponding terminal connection point. Some other terminal wires also have a plurality of terminal wire connection points within the range of one grid unit with respect to the terminal connection point.

FIG. 8 shows vias in VIA2 layer represented by shaded squares and circuit wires in M3 wiring layer, which are connected to circuit wires in M2 layer through vias in VIA2 layer. Each of these circuit wires in the M3 wiring layer is connected to a circuit connection point on another grid point 34 through a VIA1 via and a circuit wire in M2 wiring layer, and then connected to a terminal wire through a VIA1 via, or, is connected to a terminal wire through a VIA2 via and a VIA1 via provided right below the VIA2 via. The combination of the circuit wire in M2 wiring layer and the circuit wire in M3 wiring layer, which are connected with each other through the VIA2 via may be regarded as one circuit wire that connects terminals of transistors.

When wires in the fourth metal wiring layer (M4) are used as circuit wires in addition to wires in M2 and M3 wiring layers, vias in the third via layer (VIA3) are provided at ends of circuit wires in M3 wiring layer and connected to circuit wires in M4 wiring layer. In an actual integrated circuit, a circuit wire positioned to each layer is not always connected to a wire of another layer through a via, but may also be connected to a wire formed in the same layer to connect between circuit blocks. For example, the right side common gate electrode 20b of the left side basic cell 10a of the set of left side basic cells 10a and 10b forms a CLK input terminal of the flip-flop circuit 36. As shown in FIGS. 7 and 8, wires in M2 wiring layer and M3 wiring layer are connected to the terminal wire of the pad of the common gate electrode 20b, which is provided between N-type transistors 14 and 22. However, these wires are not connected to any other transistors within the circuit block. Within an actual semiconductor integrated circuit, these wires in M2 and M3 wiring layers are connected to a wire between circuit blocks and then to a terminal of another circuit block, that is, to a terminal of a transistor included in another circuit block. Thus, the wire between circuit blocks is also a part of circuit wires in that it forms a larger circuit by connecting circuit blocks.

There is a circuit wire shown at the center of FIG. 7, a part of which is not on the grid lines or, more specifically, which is bent by 45°. In this way, a circuit wire, which is not exactly along the grid points 34, may be used depending on various conditions. However, the wire is still placed along the grid points 34, or on the grid lines, at remaining portions, which are not bent by 45°.

As described above, the terminal wire formed in M1 wiring layer has a function for adjusting a positional difference between the circuit wire, which is placed along the grid points 34, and the contact 30 to the transistor terminal and connecting between them. In order to take advantage of this function, i.e., to place both the contact and the circuit wire with a fine pitch and to reduce the chip area of the semiconductor integrated circuit, it is necessary that fine terminal wires can be formed. To achieve this, it is effective to limit the types of wires being formed and to increase the pattern regularity in the wiring layer used to form the terminal wire.

In this embodiment, M1 wiring layer is used to form the terminal wire. In M1 wiring layer, only wires for connecting wells to power bus wires are formed in addition to the terminal wire. Alternatively, in the basic cell of the second embodiment described below, power bus wires are formed in M1 wiring layer in addition to terminal wires. Both wires are formed in fixed patterns and not depending on functions needed by a user. Thus, it is possible to increase the pattern regularity by carefully designing the basic cell. While other kinds of wires can be formed, it is preferable to limit types of wires that are formed in fixed patterns.

In this way, M1 wiring layer is formed in a pattern with high regularity, which is close to a simple line and space pattern. Due to the high pattern regularity, it is easy to adjust processing conditions, and a finer processing can be performed with a high stability compared to a pattern with less regularity like M2 wiring layer shown in FIG. 7, for example. Actually, in this embodiment, and also in the second embodiment described later, a minimum pitch between wires in M1 wiring layer is less than that in M2 and M3 wiring layers. More specifically, while the minimum space of M2 and M3 wiring layers is 0.4 $\mu$m, the minimum space of M1 wiring layer is 0.32 $\mu$m, which is 20% smaller.

As described above, bending the gate electrodes 20a and 20b reduces the width of the basic cell 10 of this embodiment. As a result, the number of contacts, which can be placed on the diffusion region of the transistor, is reduced. However, the terminal wire 32, which is connected to the diffusion region through one contact, having a plurality of terminal wire connection points preserves flexibility of connection. For example, terminal wires 32 of diffusion regions of the uppermost P-type transistor 12a each have two or three terminal wire connection points, which are arranged vertically. A VIA1 via is placed at the lower side terminal wire connection point of the terminal wire of the diffusion region between the gate electrodes 20a and 20b of the left side basic cell 10a of the set of center basic cells 10a and 10b, and is connected to a M2 wire extending downward. The center terminal wire connection point of the same terminal wire is not used to place a VIA1 via. Over the center terminal wire connection point is placed a M2 wire, which extends laterally without being connected to this terminal wire.

In the basic cell 10 according to this invention, the number of pads of the gate electrode is also reduced in order to increase the efficiency of the semiconductor substrate surface utilization and to reduce the height of the basic cell. In addition, a plurality of terminal wire connection points is provided on the terminal wire 32 connected to the pad through one contact 30, and the terminal wire connection points are arranged two-dimensionally such that flexibility of connection can be preserved. For example, three terminal wire connection points arranged in an L-shape form are provided for the terminal wire of the pad between the P-type transistor 12 and N-type transistor 14 of the left-side common gate electrode 20a of the left-side basic cell 10a of the right-side set of basic cells 10a and 10b. A M2 wire, which is not connected to this terminal wire, is placed above two terminal wire connection points provided vertically in line on the left side among them. Then, a VIA1 via is placed on the other terminal wire connection point provided on the right side of this terminal wire and connected to M2 wire.

The flip-flop circuit 36 is configured, as one example of circuit blocks, using the basic cell 10 of this invention shown in FIG. 1. A comparison is made between the circuit block shown in FIG. 2 and the same circuit block configured, with the same 0.25 $\mu$m design rule manufacturing process, using the conventional basic cell shown in FIG. 15, as follows:

This invention: grid pitch=0.88 $\mu$m, basic cell height= 11.00 $\mu$m, the number of lateral grids needed for the flip-flop circuit configuration=18, and area=174.24 $\mu m_2$.

Conventional Example: grid pitch=1.04 $\mu$m, basic cell height=12.24 $\mu$m, the number of lateral grids needed for the flip-flop circuit configuration=18, and area=229.13 $\mu m^2$.

It should be understood from the above comparison that the flip-flop circuit 36 configured by using the basic cell 10 of this invention achieves about a 24% area reduction as compared with the conventional example. In addition, because channel widths of the transistors are larger as described above, the circuit configured using the basic cell of this invention is superior in operation speed.

In the cell array region of the semiconductor integrated circuit with the basic cell of this invention, M1 wiring layer is used for forming terminal wires, and circuit wires are formed in M2 and higher wiring layers. Therefore, in order to manufacture the semiconductor integrated circuit by using the basic cell of this invention, it is necessary to use a manufacturing process that can use three or more metal wiring layers. However,-an advanced manufacturing process, such as a manufacturing process that 0.5 $\mu$m or 0.35 $\mu$m design rule, can generally use three or more metal wiring layers. Further, when the design rule is 0.18 $\mu$m or below, five or more wiring layers can be used generally. Moreover, an advanced semiconductor integrated circuit often is a complex large-scale integrated circuit that combines circuits formed using a cell array with macrocells, megacells, and so on. In that case, three or more wiring layers are generally required. Therefore, in the semiconductor integrated circuit with such a finer design rule, it is not a practical problem that three or more wiring layers are needed.

According to the basic cell of this invention, the smaller pitch between grid points increases the circuit wire density. Therefore, when a complex circuit block is formed, the number of layers of circuit wires can be reduced. Further, making use of the higher wire density in connection between circuit blocks can further reduce the necessary number of wiring layers. In such a case, it is possible to form a semiconductor integrated circuit with a number of wiring layers equal to, or even smaller than that in the case where the conventional basic cell is used, even if the wiring layer for forming the terminal wire is included.

At least when the number of required wiring layers is not larger than the case that uses the conventional basic cell, development time of an integrated circuit can be reduced by using the basic cell of this invention. When the conventional basic cell is used, the circuit design and mask manufacturing processes must be completed before starting a contact layer forming process because the contact layer and following layers are used for customization. On the other hand, in the case of the semiconductor integrated circuit with the basic cell of this invention, up to M1 wiring layer for forming the terminal wire are manufactured in a fixed pattern as a part of the basic cell. Therefore, processes up to M1 wiring layer forming can be completed without waiting for the completion of the design process. In other words, manufacturing of two layers (contact and M1 wiring layers) can be completed before the completion of the design process. As a result, a semiconductor integrated circuit using the basic cell of the present invention can be shipped in a shorter development time compared with that using the conventional basic cell.

The master slice may include a test element group (TEG) including one or more transistors or other devices connected with M1 wires with probe pads in the master slice. Then, it is possible to test master slices, where up to M1 wiring layer formation process has been completed. After the test, the only master slices confirmed to meet the standard can be used for the customization process, i.e., VIA1 and following manufacturing processes. Thus, it can prevent that a failure due to the transistor forming process and/or the contact and M1 forming processes is found after receiving an order from a customer and performing the wiring processes for customization, which requires the customization process be repeated. Then, average delivery time of gate array products can be shortened.

The terminal wire can be formed in a wiring layer of a conductive material such as polycrystalline silicon, a metal silicide, and a refractory metal. However, it is preferable to reduce resistance of the wire by using a low resistance metal wiring layer, which includes aluminum or copper as a main component. Outside of the cell array region, the wiring layer for forming the terminal wire can be used for other purposes. Especially, if it is a low resistance metal wiring layer, it can be also used for forming wires requiring a low resistance. Even within the cell array region, if the power supply bus wire is formed in the same wiring layer as that for the terminal wire, a low resistance metal wiring layer must be used, like the second embodiment described below.

The circuit wires are preferably formed in low resistance metal wiring layers in order to reduce the wiring resistance. Therefore, the same low resistance metal such as aluminum or copper can be used as a main component of the wiring layers used to form the terminal wires and the circuit wires. However, the exact compositions of these metal wiring layers need not to be the same. Further, the thickness of these metal wiring layers may also be different from each other. For example, the thickness of the higher wiring layers used for forming the circuit wires may be thicker than that of the lower wiring layer used for forming the terminal wires, in order to further reduce the resistance of circuit wires.

When M4 or higher wiring layers are used in addition to M2 and M3 wiring layers, it is possible to place wires in these wiring layers along the same grid points 34 on which M2 and M3 wires are placed. It is also possible to place these wires in higher wiring layers on grip points with different pitches.

Figure 9:
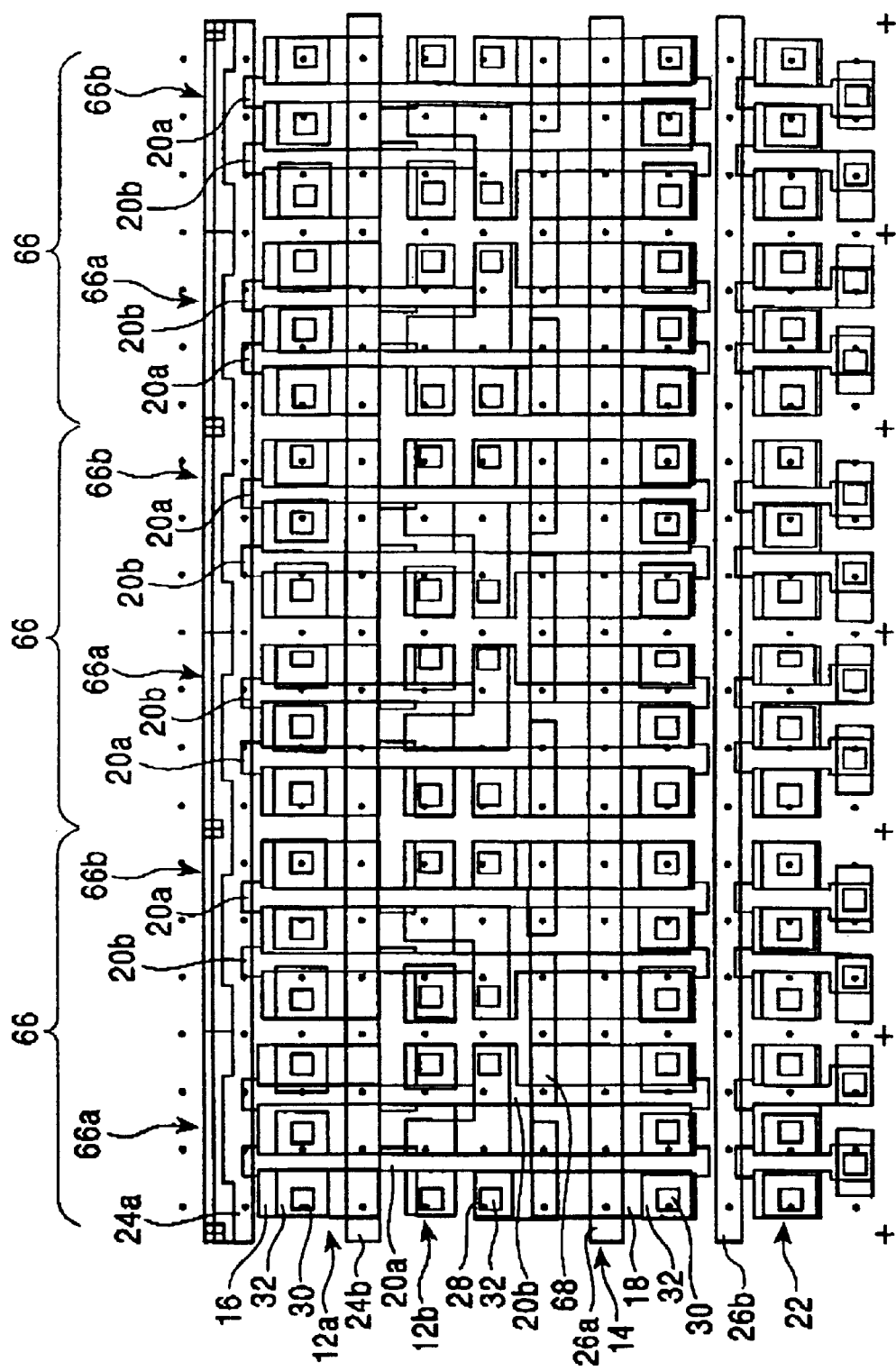
FIG. 9 is a layout diagram of a second embodiment of basic cells of this invention.

Next, FIG. 9 shows a layout diagram of a second embodiment of a basic cell according to the present invention. The basic cell shown in FIG. 9 has the same number of the same conductive type transistors as the basic cell 10 shown in FIG. 1. When two basic cells 66a and 66b, which are mirror-inverted laterally in the figure, are considered as one set, a total of three sets, that is, six basic cells 66 are arranged laterally. In reality, basic cells, which are mirror-inverted vertically, are also combined and arranged vertically to form a cell array. In the description below, a difference between the basic cell 66 shown in FIG. 9 and the basic cell 10 shown in FIG. 1 will be described.

In the basic cell 66 shown in FIG. 9, power supply lines and ground lines are wired laterally in M1 wiring layer rather than in M2 wiring layer. The power supply lines include a main power supply line 24a and a secondary power supply line 24b, which are wired on the upper side of the P-type transistors 12a and between two P-type transistors 12a and 12b, respectively. The ground lines include a main ground line 20a and a secondary ground line 26b, which are wired between the P-type transistors 12b and the N-type transistors 14 and between two N-type transistors 14 and 22, respectively.

In the basic cell 66 of this embodiment, like the basic cell 10 in FIG. 1, only one contact is placed for each of the diffusion regions of the transistors. Limiting the number of contacts and reducing the area occupied by M1 wires, which are connected to the diffusion regions through the contacts allows power bus wires to be provided in M1 wiring layer. Placing the power bus wires in M1 wiring layer improves flexibility for placing circuit wires in M2 wiring layer and for connection between transistors. Especially, it improves the flexibility for connection in the direction perpendicular to the power bus wires, or in the vertical direction.

In each of the basic cells 66a and 66b, two gate electrodes 20a and 20b are not bent and extend essentially in line in the vertical direction over the P-type and N-type active regions 16 and 18. The pad 28 where a contact 30 for connecting the gate electrode 20a and 20b with other transistors is provided at only one point for each gate electrode 20a and 20b. In the case of the example shown, the gate electrode pad 28 is provided only between the P-type transistors 12b and the N-type transistors 14. By reducing the number of the gate electrode pads more than that of the basic cell 10 shown in FIG. 1, the efficiency of semiconductor substrate surface utilization can be further improved.

The pitch between grid points 34 indicated by black dots (•) in FIG. 9 is determined by the pitch for placing vias in VIA1 layer, for example. The pitch is independent from positions of contacts 30. The circuit wires in M2 and M3 wiring layers are placed along the grid points, that is, placed on grid lines connecting between grid points 34 vertically and laterally. Also, VIA2 vias for connecting M2 wires and M3 wires are placed on the grid points 34.

The source and drain of each of the transistors 12, 14, 22 are connected to a terminal wire 32 formed in M1 wiring layer over these transistors. Each of the contacts 30 is not always placed on the grid points 34. For example, they are placed in line laterally with a minimum pitch, which prevents a short against the gate electrode and is determined by a manufacturing process technology to be used. Also, the terminal wires 32 formed in M1 wiring layer are not always on the grid lines. They are placed considering the margin needed for connection with contacts to be connected and spaces needed for preventing a short between terminal wires.

Each of terminal wires 32 has at least one terminal wire connection point. That is, each of terminal wires has a dimension to allow at least one VIA1 via to be placed. However, unlike the case of the first embodiment, terminal wire connection points are not always placed on the grid points 34. Depending on the dimension of the terminal wire, the position where VIA1 via can be placed (center position of the via in VIA1 layer) is not fixed, but it can be placed at an arbitrary position within some range. In this sense, the terminal wire connection point according to this embodiment has a certain area.

At least some of terminal wires 32 have a plurality of terminal wire connection points. That is, some of the terminal wires 32 have a dimension where a plurality of VIA1 vias can be placed with a pitch where each can be connected to another M2 wire. For example, the terminal wire 32 is connected to the common gate electrode of the P-type and N-type transistors 12 and 14 through one contact placed on the pad 28, and has a two dimensional shape (L-shape) that extends vertically and horizontally. Three grid points 34 are provided also in an L-shape on the L-shaped terminal wire. A VIA1 via can be placed at a position close to each of these grid points 34 with a margin with respect to the outer edge of the terminal wire needed by the process technology to be used. Wires in M2 layer connected to these vias can be placed with margins and spaces between them, which are needed by the process technology to be used. A plurality of terminal wire connection points provided on the terminal wire 32 improve the flexibility for connection between transistors to form desired circuit blocks by placing VIA1 vias, M2 wires, VIA2 vias, M3 wires and others. Particularly, the flexibility can be improved by providing a plurality of two-dimensionally arranged terminal wire connection points.

When a circuit block includes the basic cell 66 shown, VIA1 vias are not always on the grid points 34, as described above. The placement of the VIA1 vias is determined to ensure the connection with the terminal wire, such as the margin from the outer edge of the terminal wire to be connected, as required by the process technology to be used. On the other hand, circuit wires formed in M2 wiring layer are placed along the grid points 34 and each of the circuit wires has a circuit connection point on the grid points 34. When a VIA1 via is displaced with respect to the grid point 34, a terminal wire connection element extending from the circuit connection point placed on the grid point adjacent to the VIA1 via to the position over the VIA1 via is placed in M2 wiring layer to connect between the VIA1 via and the circuit wire. In other words, the via in VIA1 layer displaced from the grid point 34 is connected to the circuit connection point of the corresponding M2 circuit wire by extending a terminal wire connection element in the M2 wiring layer from the circuit connection point to the position over the VIA1 via. Circuit wires in M2 wiring layer and above are placed on the grid lines and vias in VIA2 layer and above are placed on the grid points 34.

According to this invention, grid points, along which circuit wires are placed, are arranged independently of positions of contacts in both of the first and second embodiments. Thus, the contact is not always placed on the grid point. Therefore, it is necessary to adjust the positional difference between the circuit wire and the contact. In the first embodiment, the positional difference is relatively small, and it can be adjusted with only the terminal wire 32 formed in M1 layer.

On the other hand, in this embodiment, the difference between the circuit wire connection point and the contact is bigger and cannot be adjusted, at least in some portions, with the terminal wire in M1 wiring layer alone. Therefore, the adjustment is made with both the terminal wire in M1 layer and the terminal wire connection element in M2 wiring layer. If the displacement is much bigger, it is also possible to use terminal wires formed in a plurality of metal wiring layers.

In the basic cells 66 shown in FIG. 9, the size in the lateral direction of a set of basic cells 66 consisting of two basic cells 66a and 66b, which are mirror-inverted laterally, is equal to seven grids of the grid points 34. That is, the width of each of basic cells 66a and 66b is equal to 3.5 grids.

Thus, the width in the lateral direction of the basic cells 66a and 66b shown in FIG. 9 is not equal to an integral multiple of the pitch between the grid points 34. The width in the lateral direction of the basic cells 10a and 10b shown in FIG. 1 is an integral multiple of the pitch of the grid points 34, and it equals three times the pitch in the embodiment above. On the other hand, in the basic cells 66a and 66b shown in FIG. 9, when two basic cells 66a and 66b are considered as one set, the width in the lateral direction of one set of the basic cells 66 is an integral multiple of the pitch of the grid points 34, and it is seven times the pitch in the embodiment above.

In the conventional basic cells 72 shown in FIG. 15, because contacts are placed on the grid points 34, the width of the basic cells is an integral multiple of the grid pitch, more specifically, k+1 times the pitch, where k is the number of gate electrodes arranged in the lateral direction and generally extending to the vertical direction. The pitch in the lateral direction of the basic cells within a cell array where basic cells are closely arranged adjacent to each other in the lateral direction is an integral multiple of the grid point pitch.

On the other hand, because the grid points are placed independently of positions of the contacts, the width of the basic cells of this invention is not always an integral multiple of the grid point pitch. However, in the first embodiment shown in FIG. 1, the width of the basic cells is reduced by bending the gate electrodes 20a and 20b so that the lateral positioning pitch of the basic cell is kept to be three times of the grid point pitch. However, in the basic cells of this embodiment, the gate electrodes are not bent. Therefore, the width is bigger than that of the basic cells 10 of the first embodiment, and the lateral positioning pitch cannot be adjusted to three times the grid point pitch with the process technology used. The next bigger integral multiple, which is four times the pitch could be used, but it is a waste of the area. Thus, the cell positioning pitch is adjusted to 3.5 times the grid pitch to adjust the width of the set of two basic cells 66a and 66b to an integral multiple, that is to seven times the grid point pitch. In this case, the waste of the area is insignificant. That is, a cell positioning pitch can be achieved which is substantially equal to the width of the basic cell when the gate electrodes 20a and 20b and the contact 30 are placed with manufacturably achievable minimum pitches.

Generally, a positioning pitch of the basic cell in the lateral direction ($P_c$) is determined such that n times the positioning pitch of the basic cell is equal to m times the grid point pitch in the lateral direction, where n is a positive integer and m is an integer, with m>n. Here, if the cell positioning pitch is not an integral multiple of the grid point pitch, $n \geq 2$. In reality, n is usually no more than four and preferably is two. In the cell array where the basic cells of FIG. 9 are arranged, the pitch of the grid points for circuit wires is smaller than the pitch between contacts placed on both sides of the gate electrode generally extending toward the vertical direction such that m>(k+1)×n can be achieved. In this case, k is the number of gate electrodes generally extending toward the vertical direction, arranged in the lateral direction, within the basic cell.

As described above, circuit wires in M2 and the higher layers are placed on the grid lines. That is the lateral pitch of circuit wires ($P_w$) is equal to the lateral pitch of the grid points. Therefore, as understood from the basic cells 66 of FIG. 9, three wires each can be placed in M2 wiring layer on the grid lines vertically over each of the basic cells 66a and 66b of a set of basic cells 66. Further, one additional wire in the vertical direction can be placed over the boundary between the two basic cells 66a and 66b. Thus, vertical 3.5 wires per basic cell including the wire placed over the boundary can be placed, which is about 17% more than where the conventional basic cells 72 shown in FIG. 15, or the basic cells 10 shown in FIG. 1, are used. As a result, it can improve the flexibility of connection.

The 3.5 wires are equal to k +1.5 where k is the number of gate electrodes generally extending toward the vertical direction and arranged laterally within a basic cell. When k+1 wires among them are formed over the basic cell, the remaining 0.5 wire can be used as a wire on the boundary. That is, vertical k+1 wires can be placed over each of the basic cells and one wire can be placed for every other boundary between adjacent basic cells. If the grid point pitch for placing circuit wires can be further reduced as compared with the basic cell width, it is possible to place k+2 wires vertically for each basic cell. In this case, it is possible that k+1 wires are placed over the cell and the remaining one wire is placed over every boundary. Depending on the process technology to be used, it may be possible to set a relationship between the cell positioning pitch and the grid point pitch such that more wires can be placed over the basic cell and/or the boundary.

In each set of basic cells 66, a buried wire 68 in M1 wiring layer, which is unconnected to any of the transistors within the basic cell, is placed near the boundary between two basic cells 66a and 66b so as to extend across the two basic cells toward the lateral direction on the upper side of the main ground line 26a. If a wire in M2 layer is placed over the boundary, the buried wire 68 has a dimension where vias for connecting other M2 wires placed on both sides of the wire over the boundary can be placed on both ends. As described later, by combining the wire in the above-described boundary region and the buried wire, the flexibility of connection can be further improved, which is more than simply increasing the number of vertical wires.

The buried wire may extend across a plurality of sets of basic cells 66 or may extend vertically. Both buried wires extending laterally and that extending vertically may be provided.

In the basic cell 66 of this embodiment, the number of pads for each of common gate electrodes 20a and 20b of the transistors 12, 14 and 22 is reduced to one, and a reduction of height of the basic cell is achieved. More specifically, the height is reduced to eleven grid pitches, that is 9.68 μm, which is about 21% smaller than that of the conventional basic cell 72 shown in FIG. 15 and about 12% smaller than that of the basic cell 10 of the first embodiment shown in FIG. 1. It should be noted that the pitch between all grid points 34 is uniform and is 0.88 μm. Vertical dimensions of active regions, which determine respective channel widths of P-type transistors 12a and 12b and N-type transistor 14 and 22 are 1.84 μm, 0.6 μm, 2.24 μm and 0.92 μm, respectively.

The width of the basic cell is 3.5 grid pitches, that is, 3.08 μm. This is about 1% smaller than that of the conventional basic cell 72, but about 17% larger than that of the basic cell 10 of the first embodiment. The area of the basic cell is 29.81 μm. This is about 22% smaller than that of the conventional basic cell 72. It is larger than that of the first embodiment, but the difference is only about 3%.

As described above, because the common gate electrodes 20a and 20b are not bent, the basic cell 66 of this embodiment is larger than the basic cell 10 of the first embodiment in width, and its area is larger. However, as the manufacturing process becomes finer, it is more difficult to form a fine and complex layout pattern with a photolithography process. Especially, if the design rule is reduced to less than 0.25 μm or 0.18 μm, the difficulty is increased, which increases the manufacturing cost. Among other layers, higher processing accuracy is required for the gate layer, because the pattern dimensions in the gate layer directly determine the transistor performance. In manufacturing such semiconductor integrated circuits with a small design rule, the difficulty of processing can be reduced by forming the gate layer in a pattern with a high regularity, which is close to the simple line and space pattern, like the basic cell 66. It can improve the productivity and yield and reduce the manufacturing cost while still keeping required processing accuracy. That is, the basic cell 66 in FIG. 9 is easily manufactured through the photolithography process due to its simple pattern, which provides an advantage that it can be manufactured at lower cost. On the other hand, the basic cell 10 shown in FIG. 1 is smaller in area than the basic cell 66 shown in FIG. 9, and realized a semiconductor integrated circuit with a higher density.

Alternatively, in the basic cell 66 in FIG. 9, by making use of the advantage of easy processing, it is possible to reduce the gate electrode width by using the same lithography equipment.

Figure 10:
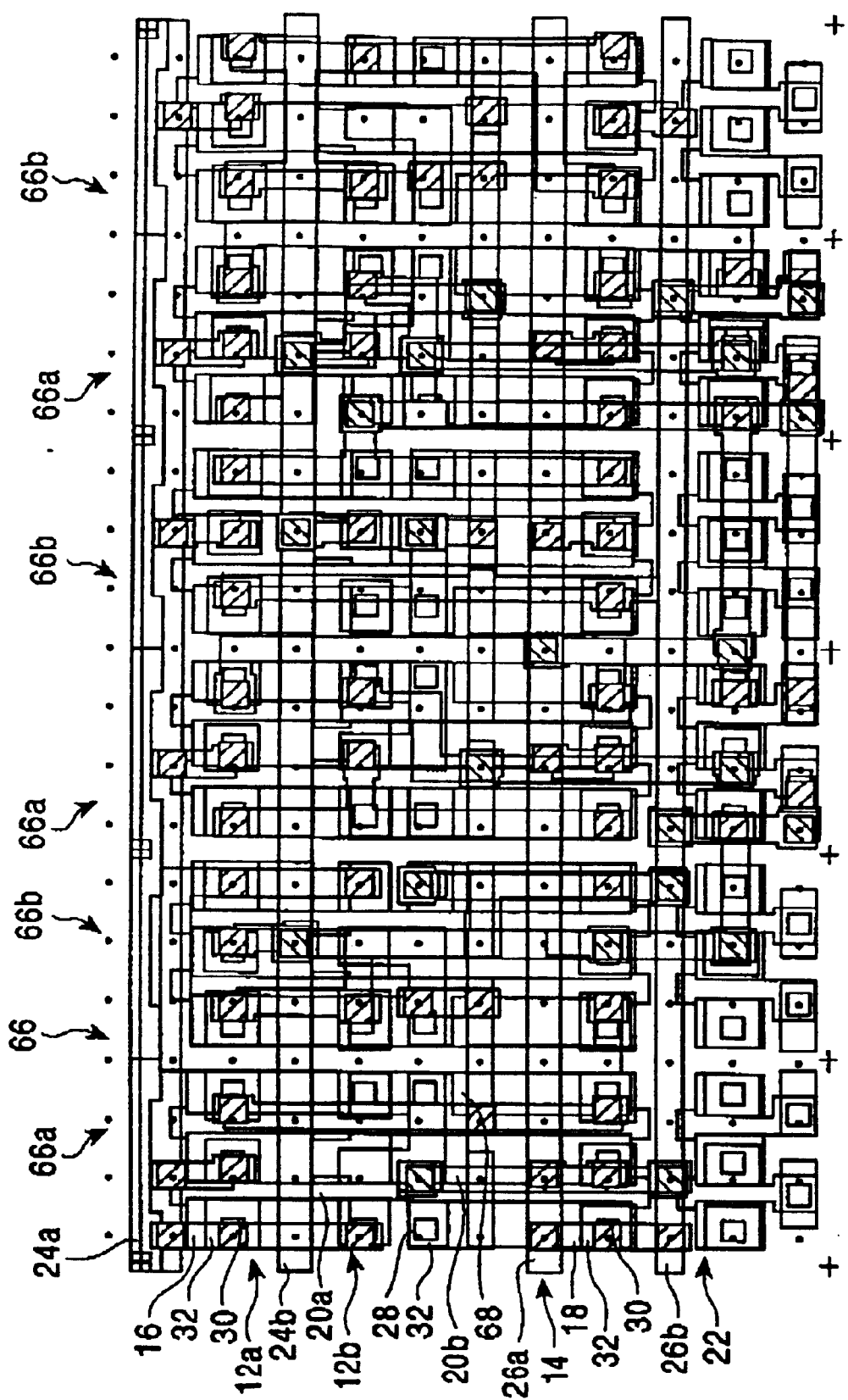
FIG. 10 is a layout diagram of an exemplary circuit block, which includes the basic cells shown in FIG. 9.

FIG. 10 shows a layout of one embodiment of a circuit block formed with the basic cells of this invention shown in FIG. 9. The same flip-flop circuit 36 shown in FIGS. 3 and 4 is configured such that it can be compared easily with the layout using the basic cell of the first embodiment shown in FIG. 2. The flip-flop circuit 36 is formed by customizing the basic cells 66, in which the elements up to M1 wiring layer shown in FIG. 9 are formed, with wiring elements in VIA1, M2, VIA2 and M3 layers.

Figure 11:
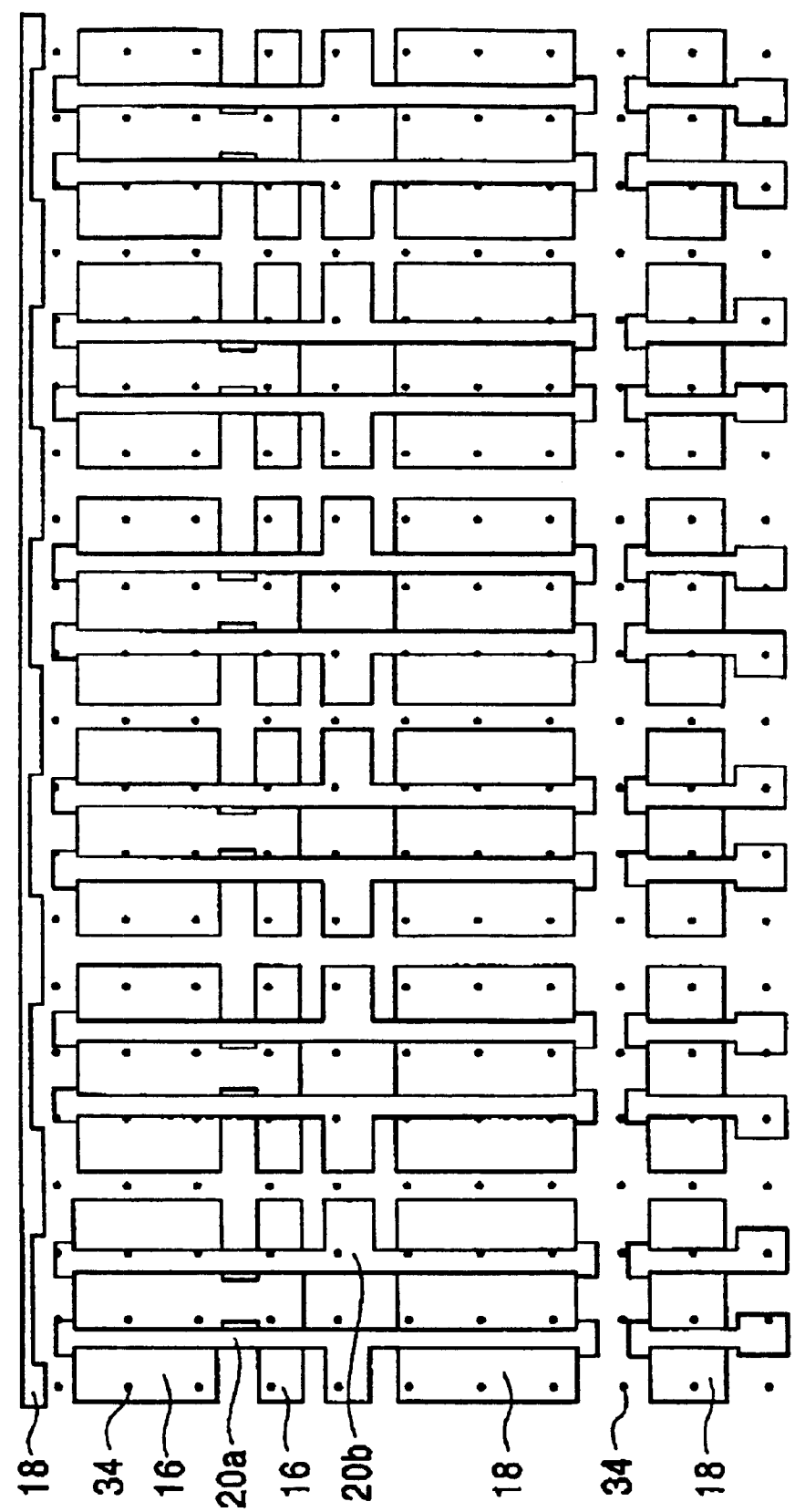
FIG. 11 is a layout diagram of P-type and N-type active layers and a gate electrode layer in the circuit block shown in FIG. 10.
Figure 12:
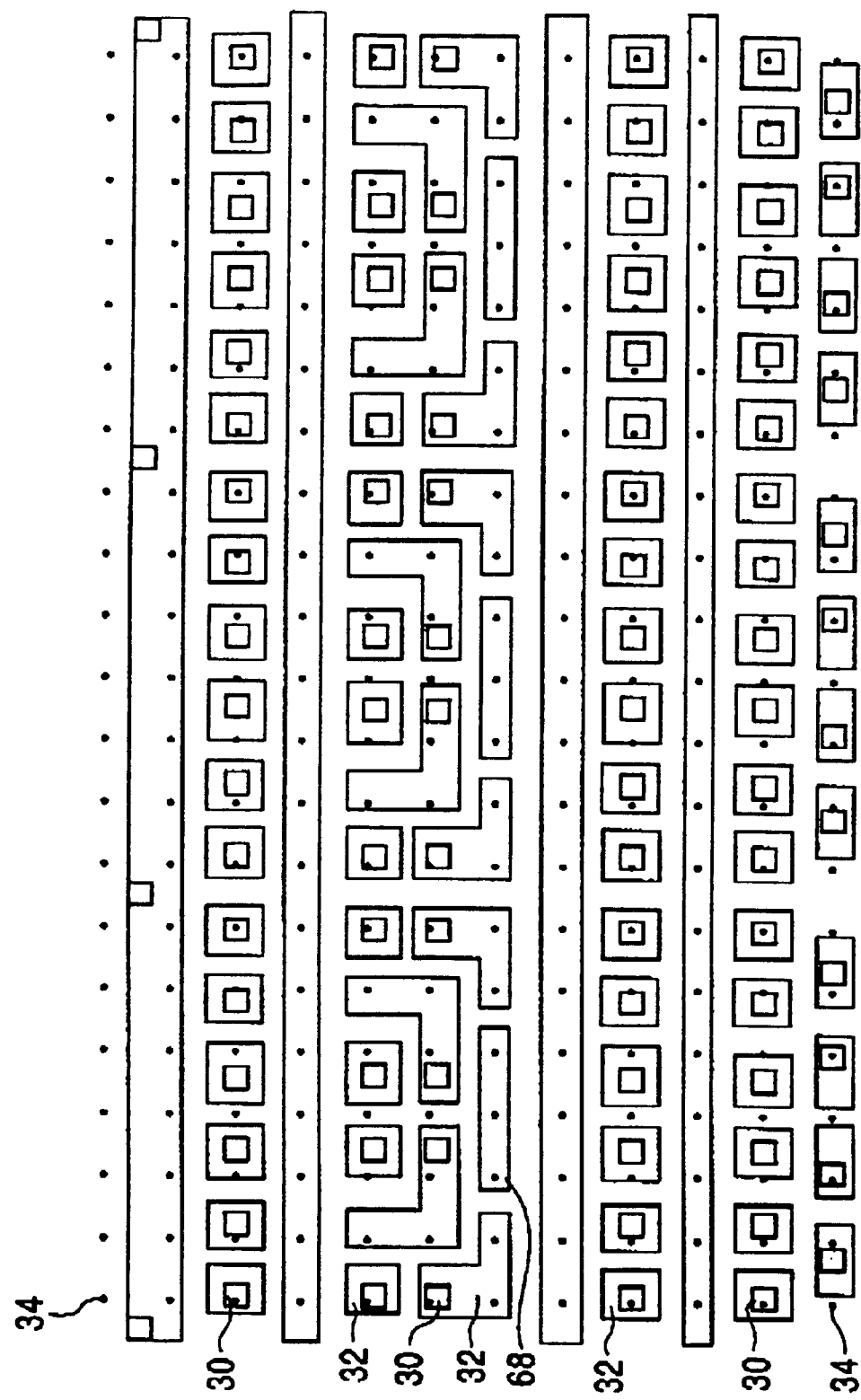
FIG. 12 is a layout diagram of a contact and M1 wiring layers in the circuit diagram shown in FIG. 10.
Figure 13:
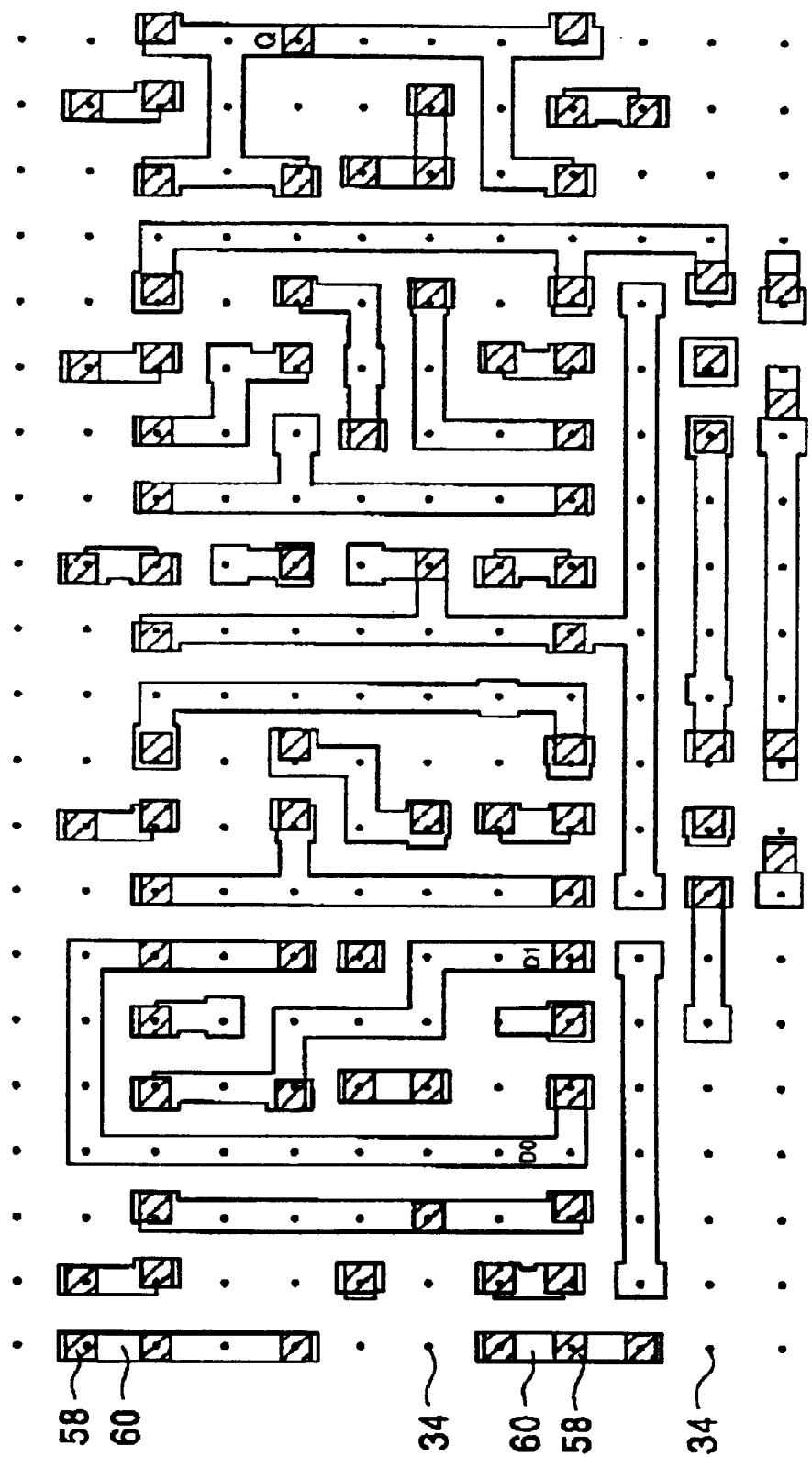
FIG. 13 is a layout diagram of VIA1 and M2 wiring layers in a circuit block shown in FIG. 10.
Figure 14:
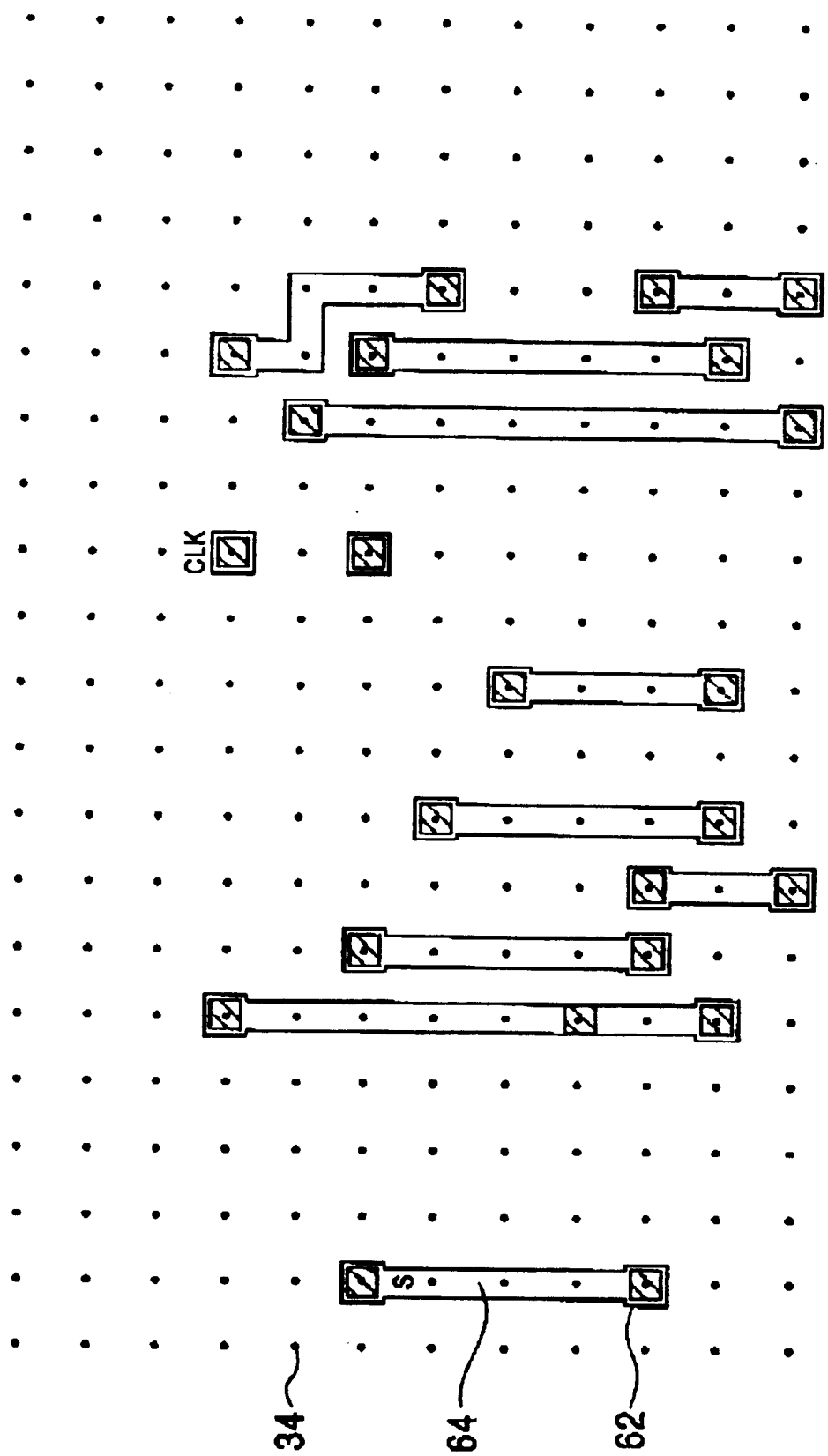
FIG. 14 is a layout diagram of VIA2 and M3 wiring layers in the circuit block shown in FIG. 10.

FIGS. 11–14 show layout diagrams for every two to three layers such that the layout diagram shown in FIG. 10 can be compared with the circuit diagram shown in FIGS. 3 and 4. FIG. 11 shows a layout of the P active layer including P-type active regions 16, an N active layer including N-type active regions 18, and the gate layer including gate electrodes 20a and 20b; FIG. 12 shows a layout of the contact layer and M1 wiring layer; FIG. 13 shows a layout of VIA1 and M2 wiring layers; and FIG. 14 shows a layout of VIA2 and M3 wiring layers. The grid points 34 for M2 and following layers are also indicated in each layout diagram.

While a flip-flop circuit is illustrated and described as an example of the circuit block in each of embodiments above, the same can be applied to the case where other circuit blocks are configured. Many of these circuit blocks of various kinds are formed on a silicon wafer and connections are made between these circuit blocks with wiring patterns in M2, VIA2, M3 layers, and, if necessary, in VIA3, M4 and higher layers, in order to obtain desired circuits.

FIG. 13 shows VIA1 and circuit wires and terminal wire connection elements placed in M2 wiring layer. The circuit wire is placed along the grid points 34. That is, it is placed such that a centerline along the length of the circuit wire is positioned on a grid line. A circuit connection point is provided on at least one end of the circuit wire at a grid point. In FIG. 13, VIA1 are indicated by shaded squares. The via in VIA1 layer is not always on the grid point 34. That is, a center of the via in VIA1 layer is not always placed on the grid point 34. Between the position over the VIA1 displaced with respect to the grid point 34, or the position above the terminal wire connection point where the VIA1 is placed, and the circuit connection point of the circuit wire, which is connected to the terminal wire through the VIA1, is placed a terminal wire connection element extending between them. Connection is made between the terminal wire and the circuit wire through the terminal wire connection element and the VIA1. In figures, the circuit wire and the terminal wire element are shown as an integral wiring element without any distinction.

In designing the circuit wire, for example, a circuit wire is first placed, which has a circuit connection point on a grid point 34 adjacent to the position of VIA1 via to be connected. That is, a circuit wire is extended to the position of the adjacent grid point 34. In reality, the via and the circuit wire are not a point or line but have a certain area or width. Therefore, even if the position of the via is displaced from the grid point 34 where the circuit connection point is placed, the via and the circuit wire are partially overlapped as far as the displacement is small. In such a case, partial connection is made between the via and the circuit wire without an additional terminal wire connection element. However, if a margin needed by the process technology cannot be maintained between the VIA1 via and the M2 wire, a terminal wire connection element is added in M2 wiring layer. The terminal wire connection element ensures the connection between the VIA1 via and the circuit wire. In the simplest way, in CAD data for forming a mask pattern, a terminal wire connection element with the size to which a margin needed to connect with the VIA1 via is added and a portion which overlaps with a data of the circuit wire is merged in order to create a data of the M2 wire. If the positional difference between the via and the circuit connection point is large and the via and the circuit wire are not overlapped with respect to one another, a terminal wire connection element with a required dimension is further added.

As described above, in the basic cell 66 of this embodiment, the terminal wire 32 of the gate common to P-type and N-type transistors 12 and 14 has a plurality of terminal wire connection points, which are placed two-dimensionally. Vias in VIA1 layer may be placed at all of the plurality of terminal wire connection points, or the vias may be placed at some of them and a circuit wire, which is not connected to the terminal wire, may be extended over other terminal wire connection points. For example, in FIGS. 11–13, a VIA1 via is placed at a left side terminal wire connection point in the terminal wire 32 of a left side common gate 20b of the right side basic cell 66b in a left side basic cell set of 66a and 66b. A via is not provided at two terminal wire connection points aligned vertically on the right side, and a M2 wire not connected to this terminal wire and extending in the vertical direction is place over these two terminal wire connection points. Likewise, a via is placed at an upper-right terminal wire connection point in the terminal wire 32 of the right side common gate of the same basic cell. A via is not provided at two terminal wire connection points aligned laterally at the bottom, and a M2 wire not connected to this terminal wire and extending toward the lateral direction is placed over these two terminal wire connection points.

As described above, in the basic cell 66 of this embodiment, it is possible to place one wire on the grid line vertically over the boundary between the set of basic sells 66a and 66b. A buried wire is also provided in the boundary region. For example, in FIGS. 10–13, a vertical M2 wire is placed at the boundary between basic cells, 66a and 66b, which form a set, on the left side. Then, a via in VIA1 layer is formed on either end of the buried wire 68 below this vertical M2 wire and connected to other two M2 wires extending vertical on both sides of the boundary. That is, the two wires on both sides of the boundary are connected with each other through the buried wire 68 without connecting to the wire in the boundary region. In other words, the buried wire 68 bypasses the wire placed in the boundary. Because the buried wire 68 is used for the bypass, it is not necessary to use a M3 wire in this part. Reducing the use of M3 wire within a circuit block increases the flexibility of connection between circuit blocks.

When the buried wire is connected to a circuit wire, a connection to a transistor is made through the circuit wire. However, because the circuit wire in not included in the basic cell, the buried wire is not connected to any of the transistors within the basic cell.

Terminal wire connection elements are placed in M2 wiring layer in the semiconductor integrated circuit with the basic cell of this embodiment. Because the terminal wire connection element is not placed along the grid point, it is difficult to apply an automatic positioning and rooting function of a CAD system. However, it does not extend the development time for each user. In a gate array semiconductor integrated circuit, various circuit blocks are designed in advance and stored as a library. When an order is received from a customer, circuit blocks are selected from the library, which are needed to implement the function required by the user. The circuit blocks may be placed within a cell array region and connected one another. The connection between circuit blocks can be performed in a short time by using an automatic positioning and rooting function of a CAD system if input and output terminals of the circuit blocks are placed on the grid points. That is, it is easy to apply the automatic positioning and rooting function of a CAD system for design works necessary for each order from a user, and the works can be completed in a short time.

It has been described that the vias in VIA1 and VIA2 layers are placed on the grid points 34, and the circuit wires in M2 and M3 wiring layers are placed along the grid points 34 in the first embodiment. It has been also described that the vias in VIA2 layer are placed on the grid points 34 and the circuit wires in M2 and M3 wiring layer are placed along the grid points 34 in the second embodiment. As described above, it is possible to perform design works in a short time by using a CAD system if those vias and wires are placed along the grid points. However, in an actually manufactured semiconductor integrated circuit, those vias and wires are not always placed exactly on or along the grid points. Even if they are placed exactly on or along the grid points on a CAD data, those vias and wires may be slightly displaced from the grid points due to errors that occur when a mask is manufactured by using the CAD data and when a semiconductor integrated circuit is manufactured by using the mask. Therefore, expressions such as "placed on the grid points 34" and "placed along the grid points 34" herein should be interpreted as meaning including such errors.

Similarly, dimensions of various features described are design values. Dimensions of features in actually manufactured semiconductor integrated circuits may differ from the described dimensions due to the limited accuracy of the manufacturing process. Also, although most features in layout figures are expressed with mutually perpendicular line segments along the grid points, small features may be rounded due to the limitation of resolution of the manufacturing equipment. For example, small contacts and via represented by squares in the figures are often formed in circles in actually manufactured semiconductor integrated circuits.

In the above-described example, the circuit wire is placed along the grid points arranged in the directions orthogonal to each other vertically and horizontally, that is, along a grid line placed in a X-Y plane. Further, grid points with the same pitch in the vertical and lateral directions are used. However, it is not always necessary to use such a grid on the X-Y plane and to set the same pitch in two directions.

The basic cell and the semiconductor integrated circuit according to this invention are basically described above. The descriptions pertain to the case where the basic cell and the semiconductor integrated circuit according to this invention are applied to a gate array semiconductor integrated circuit. However, this invention is not limited to the embodiments described above and it is obvious that various improvements and modifications may be possible without departing from the principle of this invention.

In the above-described example, a terminal wire connected to a terminal of a transistor at one terminal connection point is formed in M1 wiring layer, and a plurality of terminal wire connection points, which can be connected to a circuit wire in M2 wiring layer through a via in VIA1 layer, are provided to the terminal wire. Thus, it can improve efficiency of the semiconductor substrate surface utilization while preserving the flexibility of connection. That is, the terminal wire according to this invention reduces the number of connection points in a first layer of the semiconductor integrated circuit (an active layer and a gate electrode layer in the above-described example) in order to improve the area usage efficiency, and provides a sufficient number of connection points to a second layer (M2 wiring layer in the above-described example) in order to preserve the flexibility of connection. A terminal wire for the same purpose can be applied to various kinds of semiconductor integrated circuits. The terminal wire may be formed in various layers depending on the type of the semiconductor integrated circuit to be applied.

In the above-described example, the terminal wire for pulling out a terminal of a transistor is placed in M1 wiring layer. The terminal wire does not form a connection between transistors by itself. That is, each of the terminal wires is connected to only one of the terminal wire connection points. However, it is possible to form a local wire for connecting between specific terminals. For example, in the above-described first and second embodiments, the gate electrode 20a and 20b functions as a wire for connecting among gates of three transistors 12a, 12b and 14. However, the connection by the gate electrode has higher resistance than the connection by a metal wire. If the high resistance is unacceptable, it is possible to provide a local interconnect in M1 wiring layer. Alternatively, it is possible to use the connection by the gate electrode together with the metal local interconnect. In this case, the local interconnect may be provided separately from the terminal wire or a wire having the both functions may be provided.

In the above-described example, at least one terminal wire is provided for each of the terminals of the transistors. And, therefore, at least one terminal wire connection point is provided for each of the terminals. As a result, even if the process technology does not allow forming direct connections between circuit wires and transistor terminals, circuit wires can be connected to transistor terminals through respective terminal wires. In fact, both in the first and the second embodiments, connections between circuit connection points of circuit wires and terminal connection points of terminals are always formed through respective terminal wires. However, this invention is not necessarily limited to this embodiment. For example, when the circuit wires are formed in the first metal wiring layer, the gate terminals can be connected directly, i.e., without using terminal wires, through contacts to the circuit wires. While, connections between the circuit wires and source/drain terminals can be formed through terminal wires formed in a wiring layer of, for example, polycrystalline silicon, provided between the gate electrodes layer and the first metal wiring layer.

In the examples above, circuit wires for the customization are placed over a cell array where a plurality of basic cells with the same configuration are arranged vertically and laterally, and this invention is applied in a gate array semiconductor integrated circuit having circuits required by a user. In this case, a connection is made between a circuit connection point of a circuit wire placed in M2 or higher wiring layers and a terminal connection point of a terminal of a transistor through a terminal wire provided in M1 wiring layer, or through a terminal wire and a terminal wire connection element placed in the layer where the circuit wire is also placed. Thus, a positional displacement between the circuit connection point and the terminal connection point can be adjusted by the terminal wire, or by the terminal wire and the terminal wire connection element. Further, a pitch between grid points along which a circuit wire is placed can be determined independently of the position where the terminal connection point is placed. As a result, the wire density can be increased, and the chip area of a semiconductor integrated circuit for implementing a function required by a user can be reduced.

The connection between two layers within the semiconductor integrated circuit is made through the terminal wire, or through the terminal wire and the terminal wire connection element. Thus, arrangement in the two layers can be optimized without the necessity of aligning corresponding connection points in these layers. As a result, it can provide a higher density of the semiconductor integrated circuit, which allows a necessary function to be implemented in a small chip area. A terminal wire or a terminal wire connection element for the same purpose can be applied to various kinds of semiconductor integrated circuits.

For example, in a standard cell, it is possible that a terminal wire is placed in a layer above a wire for connecting between transistors within the cell and circuit wires between cells are connected through the terminal wires. In a standard cell, it is desirably to arrange input and output terminals of each cell on grid points with a fixed pitch such that placement of circuit wires between cells can be designed efficiently by using a CAD system. When the input and output terminals are provided on terminal wire connection points on terminal wires, wires within the cell can be placed independently of the grid points along which circuit wires between cells are placed. As a result, the area of each standard cell can be reduced. In this case, it is preferable that the terminal wire connection point is placed on the grid point and connected to the circuit wire without a terminal wire connection element. For example, wires within a cell are placed in M1 wiring layer, and terminal wires are provided in M2 wiring layer. Circuit wires between cells may be placed in M3 wiring layer and connected with the terminal wires through vias in VIA2 layer. Alternatively, circuit wires between cells in M2 wiring layer may be extended to terminal wire connection points on the grid points for connection within the same wiring layer.

Further, connection between a terminal connection point of a terminal of a transistor within a standard cell and a circuit wire within the cell for connecting transistors within the standard cell may be made through a terminal wire, or through a terminal wire and a terminal wire connection element. In this case, for example, the circuit wire and the terminal wire are formed in M2 and M1 wiring layers, respectively. When a circuit wire for connecting between transistors within a standard cell is placed along the grid points with a fixed pitch, a variety of standard cells may be developed with a CAD system in a short period. When the connection between a transistor terminal and a circuit wire connection point within a cell is made through a terminal wire, or through a terminal wire and a terminal wire connection element, the transistor can be positioned independently of the grid points of the circuit wire within the cell. Thus, standard cells with small area can be developed. In this case, the grid points for the circuit wire within the cell and the grid points for the circuit wire between cells can be common, or can be defined separately.

What is claimed is:

1. A basic cell of a gate array semiconductor integrated circuit, comprising:
   a plurality of transistors arranged on a semiconductor substrate, the transistors including a plurality of terminals; and
   a plurality of terminal wires connected to the terminals of the transistors at terminal connection points and arranged in at least one first wiring layer over the semiconductor substrate, the terminal wires having thereon a plurality of terminal wire connection points for connecting with circuit wires to be formed in at least one second wiring layer above the first wiring layer,
   wherein at least one of the terminal wires is connected to one or more of the terminals at only one of the terminal connection points and has thereon at least two of the terminal wire connection points.

2. The basic cell according to claim 1, wherein at most one of the terminal connection points is provided for each of the terminals of the transistors.

3. The basic cell according to claim 1, wherein the at least two of the terminal wire connection points of the at least one of the terminal wires are arranged two-dimensionally.

4. The basic cell according to claim 1, wherein the terminal wire connection points are arranged on grid points with a fixed pitch, and at least some of the terminal connection points are displaced from the grid points.

5. The basic cell according to claim 1, wherein the first wiring layer is a low resistance metal wiring. layer.

6. A semiconductor integrated circuit, comprising:
   a cell array including a plurality of basic cells, each of the basic cells including a plurality of transistors arranged on a semiconductor substrate and a plurality of teal wires formed in at least one first wiring layer over the semiconductor substrate, the transistors including a plurality of terminals and the terminal wires being connected to the terminals at terminal connection points; and
   a plurality of Circuit wires formed in at least one second wiring layer above the first wiring layer, and connected to respective terminal wires,
   wherein the terminal wires have thereon a plurality of terminal wire connection points for connecting with the circuit wires, and at least one of the terminal wires is connected to at least one of the terminals of the transistors at only one of the terminal connection points and has thereon at least two of the terminal wire connection points.

7. The semiconductor integrated circuit according to claim 6, wherein the circuit wires are arranged along grid points with a fixed pitch, and at least some of the terminal connection points are displaced from the grid points.

8. The semiconductor integrated circuit according to claim 6, wherein the at least two of the terminal wire connection points of the at least one of the terminal wires are arranged two-dimensionally.

9. A semiconductor integrated circuit, comprising:
   a cell array area including an array of basic cells arranged on a semiconductor substrate, each of the basic cells including a plurality of transistors having a plurality of terminals and a plurality of terminal wires formed in at least one first wiring layer over the semiconductor substrate, the terminals of the transistors having thereon terminal connection points; and
   a plurality of circuit wires formed in at least one second wiring layer above the first wiring layer, each of the circuit wires having at least one circuit connection point arranged on grid points,
   wherein:
      the transistors in each of the basic cells include k gate electrodes generally extending in a first direction and arranged in a second direction perpendicular to the first direction, and k+1 diffusion regions on both sides of the k gate electrodes, where k is an integer greater than one;
      the array of basic cells includes two adjacent ones of the basic cells arranged in the second direction;
      the grid points are arranged in the second direction with a first fixed pitch; and
      at least one of the terminal connection points connecting to the diffusion regions is displaced from the grid points such that the terminal connection points connecting to 2k+2 diffusion regions of the two adjacent ones of the basic cells are arranged in the second direction with a second fixed pitch larger than the first fixed pitch, and the displaced terminal connection point is connected to one of the circuit connection points through a corresponding one of the terminal wires.

10. The semiconductor integrated circuit according to claim 9, wherein the transistors in each of the basic cells include gate electrodes generally extending in a first direction and arranged in a second direction perpendicular to the first direction, and the displaced terminal connection point is displaced from the grid points at least in the second direction.

11. A semiconductor integrated circuit comprising:
   a cell array area including an array of basic cells arranged on a semiconductor substrate, each of the basic cells including a plurality of transistors having a plurality of terminals and a plurality of terminal wires formed in at least one first wiring layer over the semiconductor substrate, the terminals of the transistors having thereon terminal connection points; and
   a plurality of circuit wires formed in at least one second wiring layer above the first wiring layer, each of the circuit wires having at least one circuit connection point arranged on grid points,
   wherein:
      at least one of the terminal connection points is displaced from the grid points; and
      the displaced terminal connection point is connected to one of the circuit connection points through a corresponding one of the terminal wires having thereon a terminal wire connection point displaced from the grid points, and a terminal wire connection element extending in the second wiring layer between a position above the displaced terminal wire connection point to the one of the circuit connection points.

12. The semiconductor integrated circuit according to claim 11, wherein each of the terminal wires is connected to only one of the terminal connection points.

13. The semiconductor integrated circuit according to claim 11, wherein the terminal connection points are connected to the respective circuit connection points always through the respective terminal wires.

14. A semiconductor integrated circuit, comprising:
   a cell array including a plurality of basic cells arranged on a semiconductor substrate along a first direction with a pitch $P_c$, each of the basic cells including a plurality of transistors; and
   a plurality of circuit wires over the cell array, the circuit wires being placed on grid lines perpendicular to the first direction, the grid lines being arranged with a pitch $P_w$ in the first direction, wherein $P_c$ is not an integral multiple of $P_w$, and $P_c \times n$ is equal to $P_w \times m$, where each of m and n is an integer greater than one.

15. The semiconductor integrated cit according to claim 14, wherein each of the basic cells includes k gate electrodes generally extending perpendicular to the first direction and arranged in the first direction, where k in an integer greater than one, and m is greater than $(k+1) \times n$.

16. A semiconductor integrated circuit, comprising:

a cell array including a plurality of basic cells arranged on a semiconductor substrate along a first direction, each of the basic cells including a plurality of transistors;

a plurality of circuit wires over the cell array, the circuit wires being placed on grid lines perpendicular to the first direction, wherein:
   the grid lines have a first fixed pitch in the first direction, and include cell grid lines above the basic cells and boundary grid lines above boundaries between the basic cells;
   the plurality of basic cells includes two adjacent ones of the basic cells on both sides of one of the boundary grid lines;
   each one of the basic cells includes k gate electrodes generally extending to a second direction perpendicular to the first direction and arranged in the first direction, and k+1 diffusion regions on both sides of the k gate electrodes, where k is an integer greater than one; and
   2k+2 contacts to connect to the diffusion regions of the two adjacent ones of the plurality of basic cells are arranged in the first direction with a second fixed pitch larger than the first fixed pitch.

17. A semiconductor integrated circuit, comprising:

a cell array including a plurality of basic cells arranged on a semiconductor substrate along a first direction, each of the basic cells including a plurality of transistors;

a plurality of circuit wires over the cell array, the circuit wires being placed on grid lines perpendicular to the first direction, wherein:
   the grid lines have a fixed pitch in the first direction, and include cell grid lines above each of the basic cells and a boundary grid line above every other boundary between the basic cells; and
   each of the basic cells includes k gate electrodes generally extending to a second direction perpendicular to the first direction and arranged in the first direction, where k is an integer greater than one, and the cell grid lines include at least k+1 cell grid lines arranged over each of the basic cells.

18. A semiconductor integrated circuit, comprising:

a cell array including a plurality of basic cells arranged on a semiconductor substrate along a first direction, each of the basic cells including a plurality of transistors;

a plurality of circuit wires over the cell array, the circuit wires being placed on grid lines perpendicular to the first direction, wherein:
   the grid lines have a fixed pitch in the first direction, and include cell grid lines above the basic cells and boundary grid lines above boundaries between the basic cells;
   the plurality of basic cells includes two adjacent basic cells arranged on both sides of one of the boundary grid lines; and
   the circuit wires are formed in at least one first wiring layer, and each of the adjacent basic cells includes a buried wire formed in at least one second wiring layer below the first wiring layer, the buried wire is not connected to the transistors within the respective basic cells, wherein the buried wires of the adjacent basic cells are coupled to extend across the adjacent basic cells.

19. A semiconductor integrated circuit, comprising:

a cell array including a plurality of basic cells arranged on a semiconductor substrate along a first direction, each of the basic cells including a plurality of transistors;

a plurality of circuit wires formed in at least one first wiring layer, the circuit wires including a boundary circuit wire placed over a boundary between two adjacent ones of the basic cells and a cell circuit wire over each of the adjacent basic cells; and each of the adjacent basic cells further including a buried wire formed in at least one second wiring layer below the first wiring layer, the buried wires are not connected to the transistors within the respective basic cells, wherein the buried wires in the adjacent basic cells are coupled to extend across the adjacent basic cells, and the cell circuit wires over the adjacent basic cells are connected through the buried wires without connecting to the boundary circuit wire.

20. The semiconductor integrated circuit according to claim 19, wherein:

the circuit wires are placed on grid lines perpendicular to the first direction, and the grid lines are arranged with a fixed pitch in the first direction; and the cell circuit wire over each of the adjacent basic cells is connected to the buried wire in the each of the adjacent basic cells with a via placed on one of the grid lines on which each of the cell circuit wires is placed.

* * * * *